(12) United States Patent
Sandhu et al.

(10) Patent No.: US 10,090,457 B2
(45) Date of Patent: *Oct. 2, 2018

(54) SEMICONDUCTOR DEVICES WITH MAGNETIC REGIONS AND STRESSOR STRUCTURES, AND METHODS OF OPERATION

(71) Applicant: Micron Technology, Inc., Boise, ID (US)

(72) Inventors: Gurtej S. Sandhu, Boise, ID (US); Witold Kula, Gilroy, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/681,763

(22) Filed: Aug. 21, 2017

(65) Prior Publication Data
US 2017/0345996 A1 Nov. 30, 2017

Related U.S. Application Data

(63) Continuation of application No. 15/181,061, filed on Jun. 13, 2016, now Pat. No. 9,768,376, which is a
(Continued)

(51) Int. Cl.
*H01L 43/02* (2006.01)
*G11C 11/16* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ................. H01L 43/02; H01L 43/08; G11C 11/14–11/16; G11C 11/161
See application file for complete search history.

(56) References Cited

U.S. PATENT DOCUMENTS 4,882,936 A 11/1989 Garshelis
5,768,069 A 6/1998 Mauri
(Continued)

FOREIGN PATENT DOCUMENTS

CN 1510768 A 7/2004
CN 101641779 A 2/2010
(Continued)

OTHER PUBLICATIONS

Chinese Office Action from Chinese Patent Application No. 201480038446.1, (action dated Sep. 19, 2017) search report dated Apr. 10, 2017), 8 pages including English translation.
(Continued)

*Primary Examiner* — Allison P Bernstein
(74) *Attorney, Agent, or Firm* — TraskBritt

(57) ABSTRACT

A magnetic cell core includes at least one stressor structure proximate to a magnetic region (e.g., a free region or a fixed region). The magnetic region may be formed of a magnetic material exhibiting magnetostriction. During switching, the stressor structure may be subjected to a programming current passing through the magnetic cell core. In response to the current, the stressor structure may alter in size. Due to the size change, the stressor structure may exert a stress upon the magnetic region and, thereby, alter its magnetic anisotropy. In some embodiments, the MA strength of the magnetic region may be lowered during switching so that a lower programming current may be used to switch the magnetic orientation of the free region. In some embodiments, multiple stressor structures may be included in the magnetic cell core. Methods of fabrication and operation and related device structures and systems are also disclosed.

11 Claims, 10 Drawing Sheets

Related U.S. Application Data continuation of application No. 13/932,497, filed on Jul. 1, 2013, now Pat. No. 9,368,714.

(51) Int. Cl.
  *H01L 43/08* (2006.01)
  *H01L 27/22* (2006.01)
  *H01L 43/10* (2006.01)

(52) U.S. Cl.
  CPC ...... *G11C 11/1673* (2013.01); *G11C 11/1675* (2013.01); *H01L 27/222* (2013.01); *H01L 43/08* (2013.01); *H01L 43/10* (2013.01)

(56) References Cited

U.S. PATENT DOCUMENTS

| | | |
|---|---|---|
| 6,139,648 A | 10/2000 | Wun-Fogle et al. |
| 6,166,948 A | 12/2000 | Parkin et al. |
| 6,258,470 B1 | 7/2001 | Sakakima et al. |
| 6,275,363 B1 | 8/2001 | Gill |
| 6,363,000 B2 | 3/2002 | Perner et al. |
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,611,405 B1 | 8/2003 | Inomata et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,282,755 B2 | 10/2007 | Pakala et al. |
| 7,372,674 B2 | 5/2008 | Gill |
| 7,378,698 B2 | 5/2008 | Ha et al. |
| 7,379,280 B2 | 5/2008 | Fukumoto et al. |
| 7,394,626 B2 | 7/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 7,994,596 B2 | 8/2011 | Min et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,138,561 B2 | 3/2012 | Horng et al. |
| 8,223,539 B2 | 7/2012 | Smythe et al. |
| 8,310,861 B2 | 11/2012 | Liu et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,456,898 B2 | 6/2013 | Chen et al. |
| 8,461,652 B2 | 6/2013 | Tanabe |
| 8,470,462 B2 | 6/2013 | Horng et al. |
| 8,487,390 B2 | 7/2013 | Dimitrov et al. |
| 8,492,169 B2 | 7/2013 | Cao et al. |
| 8,564,080 B2 | 10/2013 | Chen et al. |
| 8,570,798 B2 | 10/2013 | Meade et al. |
| 8,587,043 B2 | 11/2013 | Natori et al. |
| 8,604,573 B2 | 12/2013 | Yamakawa et al. |
| 8,611,147 B2 | 12/2013 | Ranjan et al. |
| 8,623,452 B2 | 1/2014 | Zhou |
| 8,670,271 B2 | 3/2014 | Zheng et al. |
| 8,692,342 B2 | 4/2014 | Oh et al. |
| 8,704,320 B2 | 4/2014 | Zhu et al. |
| 8,749,003 B2 | 6/2014 | Horng et al. |
| 8,779,538 B2 | 7/2014 | Chen et al. |
| 8,803,265 B2 | 8/2014 | Lim et al. |
| 8,823,118 B2 | 9/2014 | Horng et al. |
| 8,923,038 B2 | 12/2014 | Kula et al. |
| 9,007,818 B2 | 4/2015 | Sandhu et al. |
| 9,281,466 B2 | 3/2016 | Sandhu et al. |
| 9,368,714 B2 | 6/2016 | Sandhu et al. |
| 9,461,242 B2 | 10/2016 | Sandhu et al. |
| 9,466,787 B2 | 10/2016 | Kula et al. |
| 2002/0089874 A1 | 7/2002 | Nickel et al. |
| 2002/0105827 A1 | 8/2002 | Redon et al. |
| 2003/0011939 A1 | 1/2003 | Gill |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0075959 A1 | 4/2004 | Gill |
| 2004/0091744 A1 | 5/2004 | Carey et al. |
| 2004/0120183 A1 | 6/2004 | Appenzeller et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2005/0036361 A1 | 2/2005 | Fukuzumi |
| 2005/0068683 A1 | 3/2005 | Gill |
| 2005/0087511 A1 | 4/2005 | Sharma |
| 2005/0106810 A1 | 5/2005 | Pakala |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2006/0038213 A1 | 2/2006 | Mori et al. |
| 2006/0042930 A1 | 3/2006 | Mauri |
| 2006/0081953 A1 | 4/2006 | Nguyen et al. |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0035890 A1 | 2/2007 | Sbiaa |
| 2007/0053112 A1 | 3/2007 | Papworth Parkin |
| 2007/0086121 A1 | 4/2007 | Nagase et al. |
| 2007/0188945 A1 | 8/2007 | Fuji et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0179699 A1 | 7/2008 | Horng et al. |
| 2008/0205130 A1 | 8/2008 | Sun et al. |
| 2008/0225581 A1 | 9/2008 | Yamane et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0190262 A1 | 7/2009 | Murakami et al. |
| 2009/0229111 A1 | 9/2009 | Zhao et al. |
| 2009/0257151 A1 | 10/2009 | Zhang et al. |
| 2010/0034014 A1 | 2/2010 | Ohno et al. |
| 2010/0080036 A1 | 4/2010 | Liu et al. |
| 2010/0080048 A1 | 4/2010 | Liu et al. |
| 2010/0102406 A1 | 4/2010 | Xi et al. |

(56) References Cited

U.S. PATENT DOCUMENTS

| | | |
|---|---|---|
| 2010/0109110 A1 | 5/2010 | Wang et al. |
| 2010/0110783 A1 | 5/2010 | Liu et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0200939 A1 | 8/2010 | Hosomi et al. |
| 2010/0230769 A1 | 9/2010 | Ozaki et al. |
| 2010/0240151 A1 | 9/2010 | Belen et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1 | 3/2011 | Hu et al. |
| 2011/0062537 A1 | 3/2011 | Oh et al. |
| 2011/0064969 A1 | 3/2011 | Chen et al. |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0170339 A1 | 7/2011 | Wunderlich et al. |
| 2011/0170341 A1 | 7/2011 | Butler |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012953 A1 | 1/2012 | Lottis et al. |
| 2012/0012954 A1 | 1/2012 | Yamada et al. |
| 2012/0015099 A1 | 1/2012 | Sun et al. |
| 2012/0018823 A1 | 1/2012 | Huai et al. |
| 2012/0040207 A1 | 2/2012 | Horng et al. |
| 2012/0069647 A1 | 3/2012 | Kramer |
| 2012/0074511 A1 | 3/2012 | Takahashi et al. |
| 2012/0075922 A1 | 3/2012 | Yamada et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0175717 A1 | 7/2012 | Bessho et al. |
| 2012/0205758 A1 | 8/2012 | Jan et al. |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2012/0326252 A1 | 12/2012 | Yamakawa et al. |
| 2013/0005052 A1 | 1/2013 | Hu et al. |
| 2013/0028013 A1 | 1/2013 | Ikeda et al. |
| 2013/0032911 A1 | 2/2013 | Jung et al. |
| 2013/0042081 A1 | 2/2013 | Park et al. |
| 2013/0059168 A1 | 3/2013 | Tahmasebi et al. |
| 2013/0062714 A1 | 3/2013 | Zhu et al. |
| 2013/0064011 A1 | 3/2013 | Liu et al. |
| 2013/0069185 A1 | 3/2013 | Saida et al. |
| 2013/0095656 A1 | 4/2013 | Matsui et al. |
| 2013/0140658 A1 | 6/2013 | Yumane et al. |
| 2013/0146996 A1 | 6/2013 | Yu et al. |
| 2013/0250661 A1 | 9/2013 | Sandhu et al. |
| 2013/0313665 A1 | 11/2013 | Rhie et al. |
| 2013/0334630 A1 | 12/2013 | Kula et al. |
| 2013/0334631 A1 | 12/2013 | Kinney et al. |
| 2014/0027869 A1 | 1/2014 | Lee et al. |
| 2014/0099735 A1 | 4/2014 | Horng et al. |
| 2014/0131822 A1 | 5/2014 | Shoji |
| 2014/0319521 A1 | 10/2014 | Uchida et al. |
| 2015/0001654 A1 | 1/2015 | Sandhu et al. |
| 2015/0069556 A1 | 3/2015 | Yamakawa et al. |
| 2015/0076485 A1 | 3/2015 | Sandhu et al. |
| 2015/0076633 A1 | 3/2015 | Siddik et al. |
| 2015/0249202 A1 | 9/2015 | Siddik et al. |
| 2015/0303372 A1 | 10/2015 | Meade et al. |
| 2016/0111632 A1 | 4/2016 | Sandhu et al. |
| 2016/0155932 A1 | 6/2016 | Che et al. |
| 2016/0211440 A1 | 7/2016 | Siddik et al. |
| 2016/0351793 A1 | 12/2016 | Sandhu et al. |

FOREIGN PATENT DOCUMENTS

| | | |
|---|---|---|
| CN | 102171766 A | 8/2011 |
| CN | 102592657 A | 7/2012 |
| CN | 103151454 A | 6/2013 |
| EP | 1353443 A2 | 10/2003 |
| EP | 1507266 A1 | 2/2005 |
| EP | 2385548 A1 | 11/2011 |
| EP | 2541554 A1 | 1/2013 |
| EP | 2015307 B1 | 10/2013 |
| GB | 2343308 A | 5/2000 |
| JP | 2002314049 A | 10/2002 |
| JP | 2004104076 A | 4/2004 |
| JP | 2005064050 A | 3/2005 |
| JP | 2005109201 A | 4/2005 |
| JP | 2007220854 A | 8/2007 |
| JP | 2007525847 A | 9/2007 |
| JP | 2009026944 A | 2/2009 |
| JP | 2009194366 A | 8/2009 |
| JP | 2010165790 A | 7/2010 |
| JP | 2012009786 A | 1/2012 |
| JP | 2012009804 A | 1/2012 |
| JP | 2012182219 A | 9/2012 |
| JP | 2013008868 A | 1/2013 |
| KR | 1020040092342 A | 11/2004 |
| KR | 1020070094431 A | 9/2007 |
| KR | 1020080029852 A | 4/2008 |
| KR | 1020120008295 A | 1/2012 |
| KR | 1020120027122 A | 3/2012 |
| TW | 201145460 A | 12/2011 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012128891 A1 | 9/2012 |
| WO | 2012160937 A1 | 11/2012 |
| WO | 2013080436 A1 | 6/2013 |

OTHER PUBLICATIONS

Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).

Auwarter et al., Co on h-BN/Ni(1 1 1): From Island to Island-Chain Formation and Co Intercalation, Surface Science, vol. 511, (2002), pp. 379-386.

Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).

Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.

Carrey et al., Influence of Interface Alloying on the Magnetic Properties of Co/Pd Multilayers, Applied Physics Letters, vol. 83, No. 25, (Dec. 22, 2003), pp. 5259-5261.

(56) References Cited

OTHER PUBLICATIONS

Cha et al., Atomic-Scale Spectroscopic Imaging of CoFeB/Mg-B-O/CoFeB Magnetic Tunnel Junctions, Applied Physics Letters, vol. 95, (2009), pp. 032506-1-032506-3.

Chen et al., Advances and Future Prospects of Spin-Transfer Torque Random Access Memory, IEEE Transactions on Magnetics, vol. 26, No. 6, (Jun. 2010), pp. 1873-1878.

Chinese Office Action and Search Report for Chinese Patent Application No. 201480038446.1, (dated Aug. 25, 2016), 22 pages including translation.

Office Action and Search Report for Chinese Patent Application No. 201480038446.1, (office action dated Apr. 18, 2017) (search report dated Apr. 10, 2017), 20 pages including English translation.

Diao et al., Spin Transfer Switching in Dual MgO Magnetic Tunnel Junctions, Applied Physics Letters, vol. 90, (2007), pp. 132508-1-132508-3.

Djayaprawira et al., 230% Room-Temperature Magnetoresistance in CoFeB/MgO/CoFeB Magnetic Tunnel Junctions, Applied Physics Letters, vol. 86, Issue 9, (2005), abstract only, 2 pages.

European Extended Search Report and Opinion for European Application No. 14820123, (search completed Jan. 30, 2017), 9 pages.

Farle et al., The Temperature Dependence of Magnetic Anisotropy in Ultra-Thin Films, Journal of Magnetism and Magnetic Materials, vol. 165, (1997), pp. 74-77.

Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.

Gao et al., Combinatorial Exploration of Rare-Earth-Free Permanent Magnets: Magnetic and Microstructural Properties of Fe-Co-W Thin Films, Applied Physics Letters, vol. 102, (2013), pp. 022419-1-022419-4.

Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.

Heczko et al., Strain and Concurrent Magnetization Changes in Magnetic Shape Memory Ni-Mn-Ga Single Crystals—Experiment and Model, Materials Science and Engineering A, vol. 481-482, (2008), pp. 283-287.

Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.

Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.

International Search Report of the ISA/KR, International Application No. PCT/US2014/044630, dated Oct. 17, 2014, 3 pages.

International Written Opinion of the ISA/KR, International Application No. PCT/US2014/044630, dated Oct. 17, 2014, 6 pages.

Japanese Office Action for Japanese Application No. 2016-524252, (dated Jan. 10, 2017), 12 pages including English translation.

Final Rejection for Japanese Application No. 2016-524252, (dated Jul. 4, 2017), 17 pages including English translation.

Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.

Kim et al., Effect of Annealing on Magnetic Exchange Coupling in CoPt/Co Bilayer Thin Films, Journal of Applied Physics, vol. 87, No. 9, (May 1, 2000), pp. 6140-6142.

Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, (Jun. 12-14, 2012), abstract, 1 page.

Ko et al., Effects of MgO and MgO/Pd Seed-Layers on Perpendicular Magnetic Anisotropy of CoPd Thin Films, Thin Solid Films, vol. 519, (2011), pp. 8252-8255.

Kohda et al., Width and Temperature Dependence of Lithography-Induced Magnetic Anisotropy in (Ga,Mn)As Wires, Physica E, vol. 42, (2010), pp. 2685-2689.

Notification of Reasons for Rejection for Korean Application No. 10-2016-7000289, (dated Jul. 18, 2017), 14 pages Including English translation.

Lavrijsen et al., Tuning the Interlayer Exchange Coupling Between Single Perpendicularly Magnetized CoFeB Layers, Appl. Phys. Lett., vol. 100, (2012), pp. 052411-1-052411-5.

Löhndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

Maehara et al., Tunnel Magnetoresistance Above 170% and Resistance-Area Product of 1 O (μm)2 Attained by In Situ Annealing of Ultra-Thin MgO Tunnel Barrier, Applied Physics Express, vol. 4, (2011), abstract only, 2 pages.

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684, Jan. 2, 2018.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Rodmacq et al., Influence of Thermal Annealing on the Perpendicuular Magnetic Anisotropy of Pt/Co/AlOx Trilayers, Physical Review B, vol. 79, (2009), pp. 024423-1-024423-8.

Sato et al., Perpendicular-Anisotropy CoFeB-MgO Magnetic Tunnel Junctions with a MgO/CoFeB/Ta/CoFeB/MgO Recording Structure, Applied Physics Letters, vol. 101, (2012), pp. 022414-1-022414-4.

Stone et al., Tuning of Ferromagnetism Through Anion Substitution in Ga-Mn-Pnictide Ferromagnetic Semiconductors, Physica B, vol. 401-402, (2007), pp. 454-457.

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Vitos et al., The Surface Energy of Metals, Surface Science, vol. 411, (1998), pp. 186-202.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

(56) References Cited

OTHER PUBLICATIONS

Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wilson et al., New Materials for Micro-Scale Sensors and Actuators: An Engineering Review, Materials Science and Engineering R, vol. 56, (2007), pp. 1-129.

Worledge et al., Magnetoresistance Measurement of Unpatterned Magnetic Tunnel Junction Wafers by Current-In-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

You et al., Spin Transfer Torque and Tunneling Magnetoresistance Dependences on Finite Bias Voltages and Insulator Barrier Energy, Thin Solid Films, vol. 519, (2011), pp. 8247-8251.

Yu et al., 1/f Noise in MgO Double-Barrier Magnetic Tunnel Junctions, Applied Physics Letters, vol. 98, (2011), pp. 112504-1-112504-3.

Zhang, Anisotropic Magnetomechanical Effect in $Tb0.3Dy0.7Fe2$ Alloy, Journal of Magnetism and Magnetic Materials, vol. 324, (2012), pp. 190-195.

Zhu et al., Magnetic Tunnel Junctions, MaterialsToday, vol. 9, No. 11, (Nov. 2006), pp. 36-45.

Notice of Rejection Grounds for Japanese Application No. 2016-524252, dated Mar. 13, 2017, 26 pages with English translation.

European Examination Report for European Application No. 14820123.9, dated Mar. 20, 2018, 5 pages.

Decision of Rejection for Korean Application No. 10-2016-7000289, dated Mar. 14, 2018, 3 pages with English translation.

Decision to Dismiss Amendment for Korean Application No. 10-2016-7000289, dated Mar. 14, 2018, 6 pages with English translation.

Decision of Rejection for Korean Application No. 10-2016-7000289, dated Jan. 31, 2018, 6 pages with English translation.

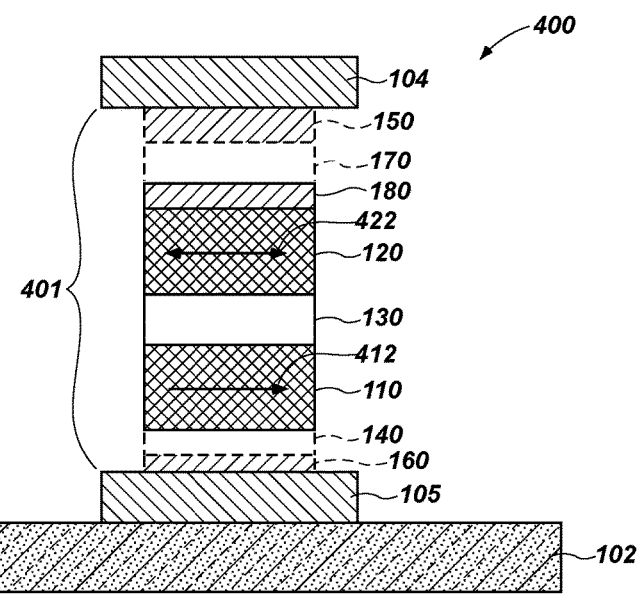
FIG. 4
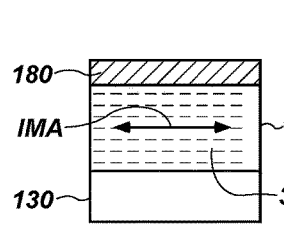 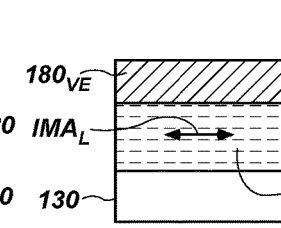 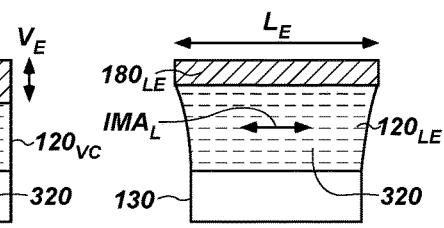
FIG. 5A  FIG. 5B  FIG. 5C
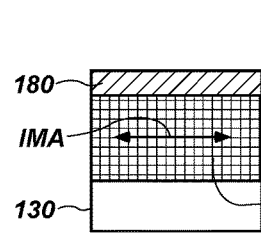 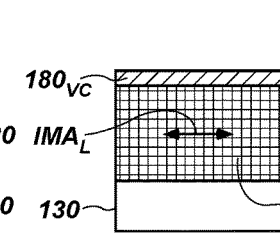 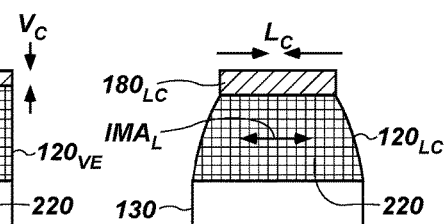
FIG. 6A  FIG. 6B  FIG. 6C

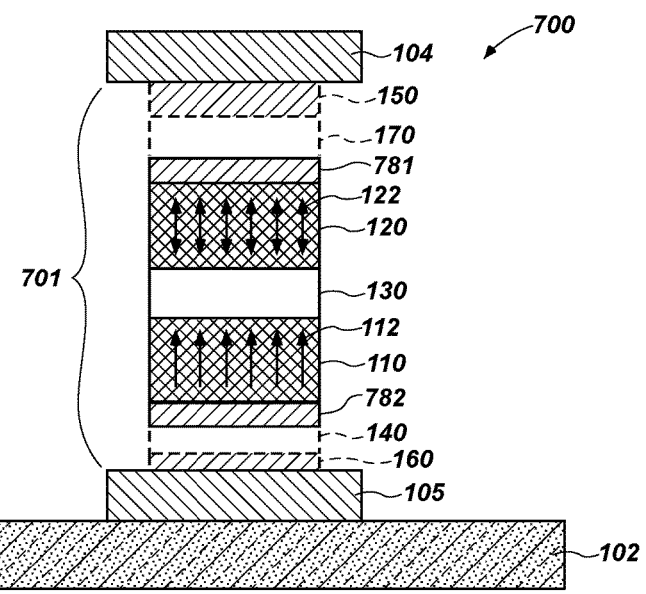
FIG. 7
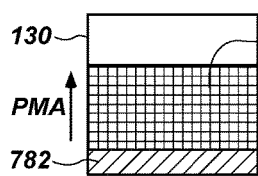 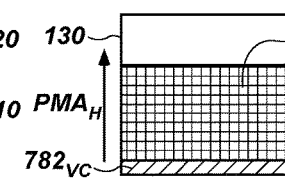 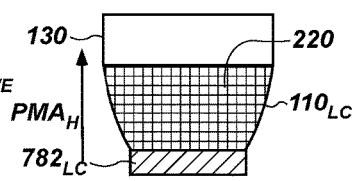
FIG. 8A  FIG. 8B  FIG. 8C
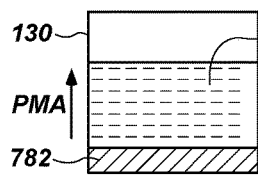 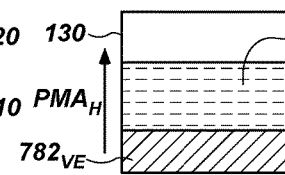 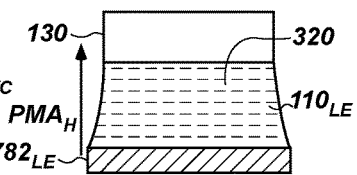
FIG. 9A  FIG. 9B  FIG. 9C

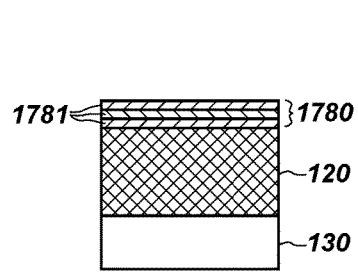
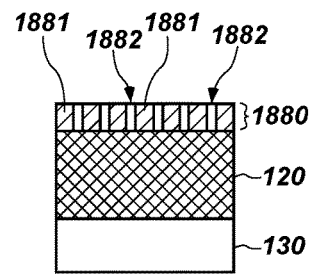
FIG. 17    FIG. 18
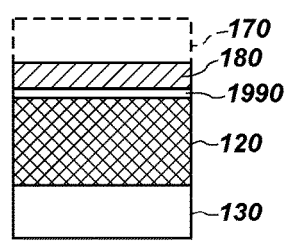
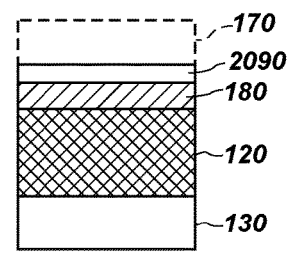
FIG. 19    FIG. 20
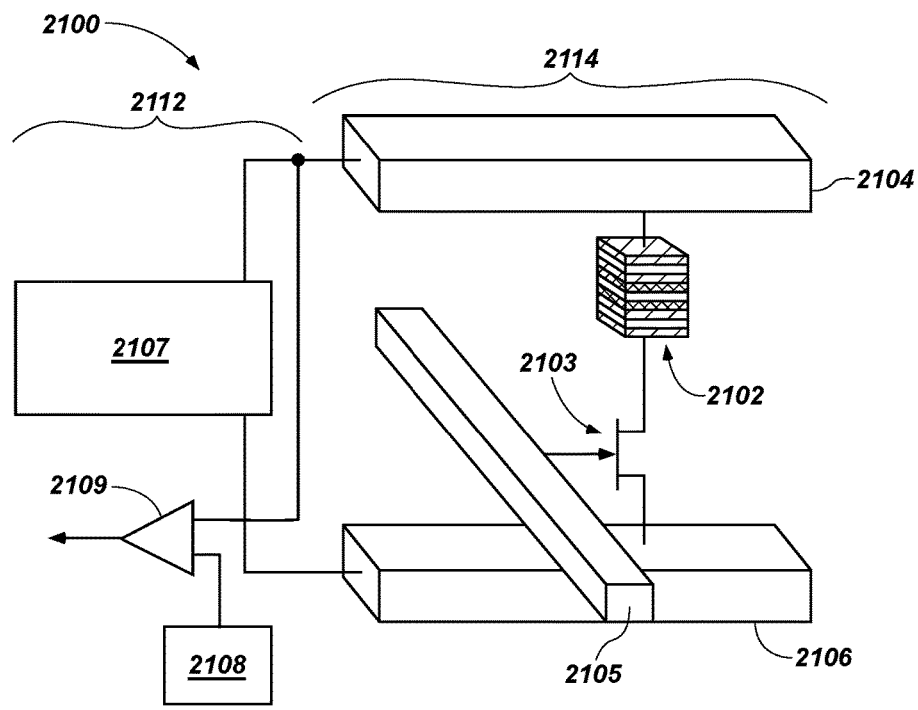
FIG. 21

SEMICONDUCTOR DEVICES WITH MAGNETIC REGIONS AND STRESSOR STRUCTURES, AND METHODS OF OPERATION

CROSS-REFERENCE TO RELATED APPLICATIONS

This application is a continuation of U.S. patent application Ser. No. 15/181,061, filed Jun. 13, 2016, now U.S. Pat. No. 9,768,376, issued Sep. 19, 2017, which is a continuation of U.S. patent application Ser. No. 13/932,497, filed Jul. 1, 2013, now U.S. Pat. No. 9,368,714, issued Jun. 14, 2016, the disclosure of each of which is hereby incorporated in its entirety herein by this reference.

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region in between. The free regions and fixed regions of STT-MRAM cells may exhibit magnetic orientations that are either horizontally oriented ("in-plane") or perpendicularly oriented ("out-of-plane") with the width of the regions.

The fixed region includes a magnetic material that has a substantially fixed (e.g., a non-switchable) magnetic orientation. The free region, on the other hand, includes a magnetic material that has a magnetic orientation that may be switched, during operation of the cell between a "parallel" configuration and an "anti-parallel" configuration. In the parallel configuration, the magnetic orientations of the fixed region and the free region are directed in the same direction (e.g., north and north, east and east, south and south, or west and west, respectively). In the "anti-parallel" configuration the magnetic orientations of the fixed region and the free region are directed in opposite directions (e.g., north and south, east and west, south and north, or west and east, respectively).

In the parallel configuration the STT-MRAM cell exhibits a lower electrical resistance across the magnetoresistive elements, i.e., the fixed region and free region. This state of low electrical resistance may be defined as a "0" logic state of the MRAM cell. In the anti-parallel configuration, the STT-MRAM cell exhibits a higher electrical resistance across the magnetoresistive elements, i.e., the regions of magnetic material, e.g., the fixed region and free region. This state of high electrical resistance may be defined as a "1" logic state of the STT-MRAM cell.

Switching of the magnetic orientation of the free region may be accomplished by passing a programming current through the magnetic cell core and the fixed and free regions therein. The fixed region within the magnetic cell core polarizes the electron spin of the programming current, and torque is created as the spin-polarized current passes through the core. The spin-polarized electron current interacts with the free region by exerting a torque on the free region. When the torque of the spin-polarized electron current passing through the core is greater than a critical switching current density ($J_c$) of the free region, the torque exerted by the spin-polarized electron current is sufficient to switch the direction of the magnetic orientation of the free region. Thus, the programming current can be used to alter the electrical resistance across the magnetic regions. The resulting high or low electrical resistance states across the magnetoresistive elements enables the write and read operations of the conventional MRAM cell. After switching the magnetic orientation of the free region to achieve the one of the parallel configuration and the anti-parallel configuration associated with a desired logic state, the magnetic orientation of the free region is usually desired to be maintained, during a "storage" stage, until the MRAM cell is to be rewritten to a different configuration (i.e., to a different logic state).

A magnetic region's magnetic anisotropy ("MA") is an indication of the strength of its magnetic orientation and, therefore, an indication of the magnetic material's resistance to alteration of the magnetic orientation. A magnetic material exhibiting a magnetic orientation with a high MA strength may be less prone to alteration of its magnetic orientation out of that orientation than a magnetic material exhibiting a magnetic orientation with a lower MA strength.

The amount of programming current required to switch the free region from the parallel configuration to the anti-parallel configuration is affected by the MA strength of the magnetic regions. A free region with a stronger (i.e., a higher) MA strength may require a greater amount of programming current to switch the magnetic orientation thereof than a free region with a weaker (i.e., a lower) MA strength. However, a free region with a weak MA strength is also often less stable during storage. That is, a free region with a weak MA strength is prone to premature alteration out of its programmed configuration (i.e., the programmed parallel or anti-parallel configuration), particularly when the fixed region of the MRAM cell has a strong MA strength. Therefore, it is often a challenge to form an MRAM cell with a free region and a fixed region having MA strengths that enable switching with minimized programming current without deteriorating the cell's ability to store the programmed logic state without failure (i.e., without premature switching of the magnetic orientation of the free region).

BRIEF DESCRIPTION OF THE DRAWINGS

FIG. 4 is a cross-sectional, elevational, schematic illustration of a magnetic cell structure including a stressor structure proximate to a free region of an in-plane STT-MRAM cell.

FIG. 5A is a partial, cross-sectional, elevational, schematic illustration of the magnetic cell structure of FIG. 4 in a storage configuration, the magnetic cell structure including a free region formed of a magnetic material having negative magnetostriction and a predominantly horizontal magnetic orientation.

FIG. 5B is a partial, cross-sectional, elevational, schematic illustration of the magnetic cell structure of FIG. 5A in a switching configuration, the magnetic cell structure including a stressor structure configured to vertically expand during switching.

FIG. 5C is a partial, cross-sectional, elevational, schematic illustration of the magnetic cell structure of FIG. 5A in a switching configuration, the magnetic cell structure including a stressor structure configured to laterally expand during switching.

FIG. 6A is a partial, cross-sectional, elevational, schematic illustration of the magnetic cell structure of FIG. 4 in a storage configuration, the magnetic cell structure including a free region formed of a magnetic material having positive magnetostriction and a predominantly horizontal magnetic orientation.

FIG. 6B is a partial, cross-sectional, elevational, schematic illustration of the magnetic cell structure of FIG. 6A in a switching configuration, the magnetic cell structure including a stressor structure configured to vertically contract during switching.

FIG. 6C is a partial, cross-sectional, elevational, schematic illustration of the magnetic cell structure of FIG. 6A in a switching configuration, the magnetic cell structure including a stressor structure configured to laterally contract during switching.

FIG. 7 is a cross-sectional, elevational, schematic illustration of a magnetic cell structure including an upper stressor structure proximate to a free region and a lower stressor structure proximate to a fixed region of an out-of-plane STT-MRAM cell.

FIG. 8A is a partial, cross-sectional, elevational, schematic illustration of the magnetic cell structure of FIG. 7 in a storage configuration, the magnetic cell structure including a fixed region formed of a magnetic material having positive magnetostriction and a predominantly vertical magnetic orientation.

FIG. 8B is a partial, cross-sectional, elevational, schematic illustration of the magnetic cell structure of FIG. 8A in a switching configuration, the magnetic cell structure including a lower stressor structure configured to vertically contract during switching.

FIG. 8C is a partial, cross-sectional, elevational, schematic illustration of the magnetic cell structure of FIG. 8A in a switching configuration, the magnetic cell structure including a lower stressor structure configured to laterally contract during switching.

FIG. 9A is a partial, cross-sectional, elevational, schematic illustration of the magnetic cell structure of FIG. 7 in a storage configuration, the magnetic cell structure including a fixed region formed of a magnetic material having negative magnetostriction and a predominantly vertical magnetic orientation.

FIG. 9B is a partial, cross-sectional, elevational, schematic illustration of the magnetic cell structure of FIG. 9A in a switching configuration, the magnetic cell structure including a lower stressor structure configured to vertically expand during switching.

FIG. 9C is a partial, cross-sectional, elevational, schematic illustration of the magnetic cell structure of FIG. 9A in a switching configuration, the magnetic cell structure including a lower stressor structure configured to laterally expand during switching.

FIG. 17 is a partial, cross-sectional, elevational, schematic illustration of a magnetic cell structure having a stressor structure formed of multiple stressor sub-regions.

FIG. 18 is a partial, cross-sectional, elevational, schematic illustration of a magnetic cell structure having a discontinuous stressor structure.

FIG. 19 is a partial, cross-sectional, elevational, schematic illustration of a magnetic cell structure having a stressor structure proximate to a magnetic region and an intermediate structure located between the stressor structure and the magnetic region.

FIG. 20 is a partial, cross-sectional, elevational, schematic illustration of a magnetic cell structure having a heater structure proximate to a stressor structure.

FIG. 21 is a schematic diagram of an STT-MRAM system including a memory having a magnetic cell structure according to an embodiment of the present disclosure.

DETAILED DESCRIPTION

Figure 1:
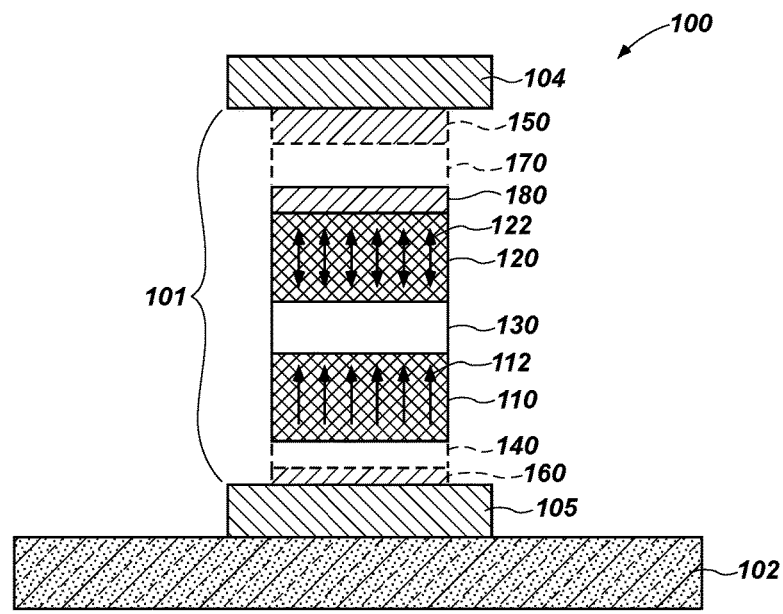
FIG. 1 is a cross-sectional, elevational, schematic illustration of a magnetic cell structure including a stressor structure proximate to a free region of an out-of-plane STT-MRAM cell.

Memory cells, semiconductor device structures including such memory cells, memory systems, and methods of forming and operating such memory cells are disclosed. The memory cells include magnetic cell cores including a magnetic region, such as a free region or a fixed region, and a stressor structure configured to exert a stress upon the magnetic region during switching to alter a magnetic anisotropy (MA) of the magnetic region during switching. The stress may be a compressive or a tensile stress. Programming current passed through the magnetic cell core during switching (i.e., during programming) may effect a structural alteration in the stressor structure, such as an expansion or contraction, which may cause a compressive or tensile stress to be exerted upon the nearby magnetic region. The resulting strain in the magnetic region may alter the magnetic anisotropy of the magnetic region. For example, the stressor structure may be configured to expand (e.g., laterally, vertically, or both) when heated, and passing the programming current through the magnetic cell core may heat the stressor structure. Expansion of the stressor structure, during programming, may stress a nearby free region (e.g., with a compressive or tensile stress). The free region may be formed of a magnetic material configured to decrease in magnetic anisotropy strength in the direction of the primary magnetic orientation of the region (i.e., in a horizontal direction, if the STT-MRAM cell is an in-plane STT-MRAM cell, or in a vertical direction, if the STT-MRAM cell is an out-of-plane STT-MRAM cell) when stressed. Therefore, passage of the programming current through the magnetic cell core may heat the stressor structure, which may cause the stressor structure to expand, which expansion may cause the free region to be stressed, which stress may result in lowering of the MA strength of the free region. Thus, during switching, a lower programming current may be used to switch the magnetic orientation of the stressed free region than would be needed were the free region not stressed. For example, the lower programming current may be up to about five times (5×) lower than the programming current that may be needed to switch the free region if not stressed. (That is, the programming current needed to switch a non-stressed free region may be up to about 500% greater than the programming current needed to switch a stressed free region.) After switching, the programming current may be terminated, the stressor structure may cool and contract back to its original dimensions, alleviating the stress on the free region, such that the MA strength of the free region may increase back to its original MA strength. Therefore, the STT-MRAM cell may be configured to enable use of a low programming current without deteriorating data retention and reliability during storage.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes a magnetic cell structure that includes a magnetic cell core including a non-magnetic region disposed between a free region and a fixed region. The non-magnetic region may be an electrically insulative (e.g., dielectric) region, in a magnetic tunnel junction ("MTJ") configuration. Alternatively, the non-magnetic region may be an electrically conductive region, in a spin-valve configuration.

As used herein, the term "magnetic cell core" means and includes a memory cell structure comprising the free region and the fixed region and through which, during use and operation of the memory cell, current may be passed (i.e., flowed) to effect a parallel or anti-parallel configuration of the magnetic orientations of the free region and the fixed region.

As used herein, the term "magnetic region" means a region that exhibits magnetism. A magnetic region includes a magnetic material and may also include one or more non-magnetic materials.

As used herein, the term "magnetic material" means and includes both ferromagnetic materials, ferrimagnetic materials, and antiferromagnetic materials.

As used herein, the term "fixed region" means and includes a magnetic region within the STT-MRAM cell that includes a magnetic material and that has a fixed magnetic orientation during use and operation of the STT-MRAM cell in that a current or applied field effecting a change in the magnetization direction of one magnetic region, e.g., the free region, of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Each of the magnetic sub-regions may include one or more materials and one or more regions therein. As another example, the fixed region may be configured as a single, homogeneous magnetic material. Accordingly, the fixed region may have uniform magnetization, or sub-regions of differing magnetization that, overall, effect the fixed region having a fixed magnetic orientation during use and operation of the STT-MRAM cell.

As used herein, the term "free region" means and includes a magnetic region within the STT-MRAM cell that includes a magnetic material and that has a switchable magnetic orientation during use and operation of the STT-MRAM cell. The magnetic orientation may be switched between a parallel configuration and an anti-parallel configuration by the application of a current or applied field.

As used herein, "switching" means and includes a stage of use and operation of the memory cell during which programming current is passed through the magnetic cell core of the STT-MRAM cell to effect a parallel or anti-parallel configuration of the magnetic orientations of the free region and the fixed region.

As used herein, "storage" means and includes a stage of use and operation of the memory cell during which programming current is not passed through the magnetic cell core of the STT-MRAM cell and in which the parallel or anti-parallel configuration of the magnetic orientations of the free region and the fixed region is not altered.

As used herein, the terms "expand" and "expansion," when used in reference to a material's change in size, means and includes the material increasing in size, along an axis, more than a neighboring material increases in size along the axis. The terms also refer to a material increasing in size, along an axis, while a neighboring material does not change in size or decreases in size along the axis. The referenced "neighboring material" is a material that is adjacent to the expanding material along the same axis on which the expanding material increases in size. The end result of the change in size is that the ratio of the size of the material to the neighboring material after the expansion is greater than the ratio of the size of the material to the neighboring material before the expansion. Thus, a material that triples in length or height may be said to "expand" if a neighboring material merely doubles in length or height. Additionally, a material that increases in size while a neighboring material does not change in size or reduces in size may also be said to "expand." In the context of "lateral expansion," the referenced neighboring material is a material laterally adjacent to the expanding material. Thus, a laterally expanded material may be "expanded" relative to the laterally-adjacent material and may exert a lateral compressive stress upon such neighboring material. The laterally-expanded material may also exert a lateral tensile stress upon vertically adjacent materials, which lateral tensile stress may effect a lateral expansion of the vertically-adjacent materials. In the context of "vertical expansion," the referenced neighboring material is a material vertically adjacent to the expanding material. Thus, a vertically expanded material may be "expanded" relative to the vertically-adjacent material and may exert a vertical compressive stress upon such neighboring material. The vertically-expanded material may also exert a vertical tensile stress upon laterally adjacent materials, which vertical tensile stress may effect a vertical expansion of the laterally-adjacent materials.

As used herein, the terms "contract" and "contraction," when used in reference to a material's change in size, means and includes the material decreasing in size, along an axis, more than a neighboring material decreases in size along the axis. The terms also refer to a material decreasing in size, along an axis, while a neighboring material does not change in size or increases in size along the axis. The referenced "neighboring material" is a material that is adjacent to the contracting material along the same axis on which the contracting material decreases in size. The end result of the change in size is that the ratio of the size of the material to the neighboring material after the contraction is less than the ratio of the size of the material to the neighboring material before the contraction. Thus, a material that shrinks in size while a neighboring material expands or does not change in size may be said to "contract." Moreover, a material that shrinks in size more than a neighboring material shrinks in size may be said to "contract." Additionally, however, a material that doubles in length or height may be said to "contract" if a neighboring material triples in length or height. In the context of "lateral contraction," the referenced neighboring material is a material laterally adjacent to the contracting material. Thus, a laterally contracted material may be "contracted" relative to the laterally-adjacent material and may exert a lateral tensile stress upon such neighboring material. The laterally-contracted material may also exert a lateral compressive stress upon vertically adjacent materials, which lateral compressive stress may effect a lateral contraction of the vertically-adjacent materials. In the context of "vertical contraction," the referenced neighboring material is a material vertically adjacent to the contracting material. Thus, a vertically contracted material may be "contracted" relative to the vertically-adjacent material and may exert a vertical tensile stress upon such neighboring material. The vertically-contracted material may also exert a vertical compressive stress upon laterally adjacent material, which vertical compressive stress may effect a vertical contraction of the laterally-adjacent materials.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "sub-region" means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region not directly adjacent to the other materials, regions, or sub-regions.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but may include deviations in shapes that result, for example, from manufacturing techniques. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes a magnetic cell core that includes at least one magnetic region (e.g., a free region or a fixed region) and a stressor structure proximate to the magnetic region. The stressor structure is configured to exert a stress upon the magnetic region during switching of the memory cell. The stress effects an alteration in a magnetic anisotropy ("MA") of the stressed magnetic region during switching. After switching, the stress may be alleviated and the MA of the magnetic region may revert to substantially its previous level. The stressor structure may therefore be configured to cause a decrease in the MA strength of a free region during switching or an increase in the MA strength of a fixed region during switching.

The memory cells of embodiments of the present disclosure may be configured as either in-plane STT-MRAM cells or out-of-plane STT-MRAM cells. "In-plane" STT-MRAM cells include magnetic regions exhibiting a magnetic orientation that is predominantly oriented in a horizontal direction, while "out-of-plane" STT-MRAM cells include magnetic regions exhibiting a magnetic orientation that is predominantly oriented in a vertical direction. As used herein "direction" when referring to magnetic orientation refers to the predominant direction of the magnetic orientation.

FIGS. 1 through 3C illustrate an embodiment of an out-of-plane STT-MRAM cell. With reference to FIG. 1, illustrated is a magnetic cell structure 100 of an out-of-plane STT-MRAM cell according to an embodiment of the present disclosure. The magnetic cell structure 100 includes a magnetic cell core 101 over a substrate 102. The magnetic cell core 101 may be disposed between an upper electrode 104 above and a lower electrode 105 below. The magnetic cell core 101 includes at least two magnetic regions, for example, a "fixed region" 110 and a "free region" 120 with a nonmagnetic region 130 in between. One or more lower intermediary regions 140 and one or more upper intermediary regions 150 may, optionally, be disposed under and over, respectively, the magnetic regions (e.g., the fixed region 110 and the free region 120) of the magnetic cell structure 100.

In some embodiments, as illustrated in FIG. 1, the magnetic cell core 101 may include an optional conductive material forming a seed region 160 over the substrate 102. The seed region 160, if present, or the lower intermediary regions 140, if the seed region 160 is not present, may be formed over a bottom conductive material of a lower electrode 105, which may include, for example and without limitation, copper, tungsten, titanium, tantalum, a nitride of any of the foregoing, or a combination thereof. The seed region 160, if present, may include, for example and without limitation, a nickel-based material and may be configured to control the crystal structure of an overlying material or region. The lower intermediary regions 140, if present, may include materials configured to ensure a desired crystal structure of overlying materials in the magnetic cell core 101.

The magnetic cell structure 100 may, in some embodiments, optionally include an oxide capping region 170, which may include oxides such as magnesium oxide (MgO), aluminum oxide ($Al_2O_3$), titanium oxide ($TiO_2$), tantalum pentoxide ($Ta_2O_5$), or combinations thereof. In some embodiments, the oxide capping region 170 may include the same materials, structure, or both of the nonmagnetic region 130, for example, the oxide capping region 170 and the nonmagnetic region 130 may both include a magnesium oxide (e.g., MgO), an aluminum oxide, a titanium oxide, a zinc oxide, hafnium oxide, a ruthenium oxide, or a tantalum oxide. The oxide capping region 170 and the nonmagnetic region 130 may include one or more nonmagnetic materials.

The optional upper intermediary regions 150, if present, may include materials configured to ensure a desired crystal structure in neighboring materials of the magnetic cell core 101. The upper intermediary regions 150 may alternatively or additionally include metal materials configured to aid in patterning processes during fabrication of the magnetic cell core 101, barrier materials, or other materials of conventional STT-MRAM cell core structures. In some embodiments, such as that illustrated in FIG. 1, the upper intermediary regions 150 may include a conductive capping region, which may include one or more materials such as copper, tantalum, titanium, tungsten, ruthenium, tantalum nitride, or titanium nitride.

As illustrated in FIG. 1, the STT-MRAM cell may be configured to exhibit a vertical magnetic orientation in at least one of the magnetic regions (e.g., the fixed region 110 and the free region 120). The vertical magnetic orientation exhibited may be characterized by the perpendicular magnetic anisotropy ("PMA") strength. As illustrated in FIG. 1 by arrows 112 and double-pointed arrows 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIG. 1. The magnetic orientation of the free region 120, on the other hand, may be switched, during operation of the cell, between a parallel configuration and an anti-parallel configuration, as indicated by double-pointed arrows 122 of FIG. 1.

The magnetic cell core 101 also includes a stressor structure 180 proximate to at least one of the free region 120 and the fixed region 110. As illustrated in the embodiment of FIG. 1, the stressor structure 180 may be proximate to the free region 120. The stressor structure 180 may be formed of a material, e.g., a nonmagnetic material, configured to change shape, in at least one dimension (e.g., height, width), during programming of the STT-MRAM cell. One or more of the structural configuration, the location, and material composition of the stressor structure 180 may be tailored to enable the stressor structure 180 to alter in shape during programming to apply a desired magnitude and direction of stress upon a neighboring region. As used herein, the term "configured," when referring to the stressor structure 180, means and includes a stressor structure 180 having at least one of its structural configuration, its location (e.g., relative to the magnetic material being impacted), and material composition tailored so as to enable the result for which the stressor structure 180 is described to be "configured."

The stressor structure 180 may be configured to expand or contract (i.e., to reduce in dimension or to expand less than a neighboring material) during programming in response to a change in a condition during programming, such as an increase in temperature or a drop in voltage. For example, passing a programming current through the magnetic cell core 101, including the stressor structure 180, during switching of the STT-MRAM cell may heat the material of the stressor structure 180 and other materials within the magnetic cell core 101. Therefore, during programming, the dimensions of the stressor structure 180, if configured to respond to a temperature change, may be altered, causing a physical stress to be exerted by the altered stressor structure 180 upon the neighboring magnetic material. The stress may be alleviated when the programming current is halted, causing the temperature to return to a pre-switching level and the stressor structure 180 to return to its pre-switching dimensions.

In embodiments in which the stressor structure 180 is configured to respond to a temperature change, the stressor structure 180 may be formed of a material having a coefficient of thermal expansion that is different than (e.g., at least about 0.1% greater than or at least about 0.1% less than) a coefficient of thermal expansion of a neighboring material, e.g., a neighboring magnetic material of a neighboring magnetic region. As such, the stressor structure 180 may be configured to expand or contract at a different rate, when exposed to a temperature change, than a neighboring material, e.g., a neighboring magnetic material. For example, and without limitation, the stressor structure 180 may be formed of or comprise a metal (e.g., aluminum (Al), copper (Cu)) or other material (e.g., silicon (Si), germanium (Ge)) having a higher coefficient of thermal expansion (e.g., compared to the coefficient of thermal expansion of at least the material of the magnetic region to be stressed by the stressor structure 180), and may, thus, be configured to expand more than a neighboring material, when subjected to a programming current during switching that heats the stressor structure 180, and exert a stress upon a neighboring magnetic region. In other embodiments, the stressor structure 180 may be configured to reduce in volume, when subjected to a programming current during switching that heats the stressor structure 180, and exert a stress upon a neighboring magnetic region. Such stressor structure 180 may be formed of a material having a negative coefficient of thermal expansion. Alternatively, the stressor structure 180 may be formed of or comprise a material having a lower coefficient of thermal expansion than a neighboring material, such that, when the materials of the magnetic cell core 101 are subjected to a programming current during switching that heats the materials, the stressor structure 180 may expand less than the neighboring material. Thus, the stressor structure 180 may contract relative to the neighboring material.

In embodiments in which the stressor structure 180 is configured to respond to a voltage change, the stressor structure 180 may be formed of a piezoelectric material that changes shape (e.g., expands or contracts, relative to a neighboring material) in response to a change in voltage across its thickness during programming.

Depending on the materials neighboring the stressor structure 180 within the magnetic cell core 101 or external to the magnetic cell core 101, the stressor structure 180 may be configured to alter a dimension primarily in one direction. For example, the stressor structure 180 may be configured to vertically expand, to vertically contract, to laterally expand, or to laterally contract when exposed to the conditions of the switching stage. Thus, it is contemplated that the materials and structural configuration of the stressor structure 180 may be tailored to accomplish a desired dimensional alteration and its corresponding stress exertion upon the neighboring magnetic region. The material of the stressor structure 180 may also be formulated to be inert (e.g., to not chemically react) with neighboring materials at processing temperatures.

The free region 120 and the fixed region 110 may be formed from or comprise a magnetic material 220 (see FIG. 2A) having positive magnetostriction or a magnetic material 320 (see FIG. 3A) having negative magnetostriction. As used herein, "magnetostriction" refers to a property of a magnetic material that causes the material to change its shape or dimensions during the process of magnetization. A magnetic material 220 having "positive magnetostriction" tends to elongate in the direction of its magnetization (i.e., in the direction of its magnetic orientation), while a magnetic material 320 having "negative magnetostriction" tends to contract in the direction of its magnetization. An MA strength in the direction of predominant magnetic orientation of a magnetic material 220 with positive magnetostriction may increase when the magnetic material 220 is expanded (e.g., pulled) in the direction of its magnetic orientation but may decrease when the magnetic material 220 is compressed (e.g., pushed) against the direction of its magnetic orientation. An MA strength in the direction of predominant magnetic orientation of a magnetic material 320 with negative magnetostriction may decrease when the magnetic material 320 is expanded (e.g., pulled) in the direction of its magnetic orientation but may increase when the magnetic material 320 is compressed (e.g., pushed) against the direction of its magnetic orientation. Thus, according to embodiments of the present disclosure, at least one of the free region 120 and the fixed region 110 may be configured to be expanded or compressed, along its direction of predominant magnetic orientation, during switching to effect an alteration to the MA strength in the expanded or contracted region during switching. The physical expansion or physical compression may result from a stress exerted on the magnetic region by the stressor structure 180 as it is altered during programming, as discussed above.

One or both of the magnetic regions (e.g., the fixed region 110 and the free region 120) of the magnetic cell core 101 may comprise, consist essentially of, or consist of magnetic material exhibiting either positive or negative magnetostriction. Magnetic material 220 exhibiting positive magnetostriction may include, for example and without limitation, ferromagnetic material including cobalt (Co) and iron (Fe) (e.g., CoFe, CoFeB) with a cobalt to iron (Co:Fe) ratio of less than 9:1. Magnetic material 320 exhibiting negative magnetostriction may include, for example and without limitation, ferromagnetic material including cobalt (Co) and iron (Fe) (e.g., CoFe, CoFeB) with a cobalt to iron (Co:Fe) ratio of greater than 9:1. Other magnetic materials that may, optionally, be included in the fixed region 110, the free region 120, or both include, for example and without limitation, Co, Fe, Ni or their alloys, NiFe, CoNiFe, or doped alloys CoX, CoFeX, CoNiFeX (X=B, Cu, Re, Ru, Rh, Hf, Pd, Pt, C), or other half-metallic ferromagnetic materials, such as, for example, NiMnSb and PtMnSb.

In some embodiments, magnetic regions (e.g., the fixed region 110 and the free region 120) include both magnetic materials exhibiting magnetostriction and magnetic materials not exhibiting magnetostriction. Nonetheless, the MA strength of the magnetic region may decrease or increase when the magnetic region is stressed.

Alternatively or additionally, in some embodiments, the free region 120, the fixed region 110, or both, may be formed from or comprise a plurality of materials, some of which may be magnetic materials (e.g., magnetic materials exhibiting magnetostriction and magnetic materials not exhibiting magnetostriction) and some of which may be nonmagnetic materials. For example, some such multi-material free regions, fixed regions, or both, may include multiple sub-regions. For example, and without limitation, the free region 120, the fixed region 110, or both, may be formed from or comprise repeating sub-regions of cobalt and platinum, wherein a sub-region of platinum may be disposed between sub-regions of cobalt. As another example, without limitation, the free region 120, the fixed region 110, or both, may comprise repeating sub-regions of cobalt and nickel, wherein a sub-region of nickel may be disposed between sub-regions of cobalt.

The compositions and structures (e.g., the thicknesses and other physical dimensions) of the free region 120 and the fixed region 110 may be the same or different.

Figure 2A:
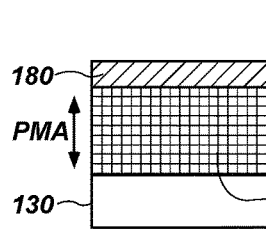
FIG. 2A is a partial, cross-sectional, elevational, schematic illustration of the magnetic cell structure of FIG. 1 in a storage configuration, the magnetic cell structure including a free region formed of a magnetic material having positive magnetostriction and a predominantly vertical magnetic orientation.

With reference to FIG. 2A, illustrated is a free region 120 of the magnetic cell structure 100 of FIG. 1, wherein the free region 120 is formed of the magnetic material 220 having positive magnetostriction. FIG. 2A illustrates the stressor structure 180 and the free region 120 during a storage state in which a programming current is not being passed through the magnetic cell core 101 (FIG. 1). The free region 120, in such "storage configuration" exhibits a vertical magnetic orientation having a perpendicular magnetic anisotropy with a certain magnitude, represented by arrow PMA.

Figure 2B:
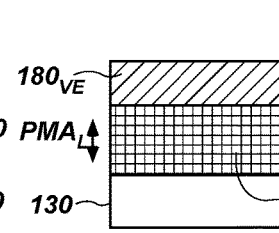
FIG. 2B is a partial, cross-sectional, elevational, schematic illustration of the magnetic cell structure of FIG. 2A in a switching configuration, the magnetic cell structure including a stressor structure configured to vertically expand during switching.

In some embodiments, the stressor structure 180 is configured to vertically expand under the conditions of a switching stage, e.g., when a programming current is passed through the magnetic cell core 101 (FIG. 1) and heats the stressor structure 180. In such embodiments, as illustrated in FIG. 2B, expansion in the direction indicated by arrow $V_E$ creates a vertically expanded stressor structure 180$_{VE}$ that exerts a vertical compressive force on the neighboring magnetic material 220. A resulting vertically compressed free region 120$_{VC}$ may exhibit a lowered PMA, as indicated by the lesser magnitude of arrow PMA$_L$ compared to the magnitude of arrow PMA of FIG. 2A. Thus, during switching, the programming current results in the vertically expanded stressor structure 180$_{VE}$, the vertically compressed free region 120$_{VC}$, and the lowered PMA$_L$. The lowered PMA$_L$ may enable switching of the magnetic orientation of the vertically compressed free region 120$_{VC}$ at a lower programming current than would otherwise be utilized.

Following switching, the application of the programming current may be stopped, which may result in a return to pre-switching conditions, including temperature, during which the vertically expanded stressor structure 180$_{VE}$ may return to the storage configuration illustrated in FIG. 2A, alleviating the stress previously exerted to form the vertically compressed free region 120$_{VC}$. Thus, the vertically compressed free region 120$_{VC}$ may expand to its storage configuration illustrated in FIG. 2A, and the lowered PMA$_L$ may increase to the PMA of the free region 120 in FIG. 2A. Therefore, the lowered PMA$_L$ may be exhibited by the vertically compressed free region 120$_{VC}$ during switching, while the original PMA may be exhibited by the free region 120 during storage. Accordingly, the free region 120 may enable switching at a lower programming current without deteriorating data retention during storage.

Differentiating between the PMA strength during switching and during storage may accommodate scalability of the magnetic cell structures 100. For example, enabling the fixed region 110 to be switched at a lower programming current, without deteriorating the PMA strength of the fixed region 110 during storage may enable fabrication of a smaller fixed region 110 without deteriorating the functionality of the fixed region 110.

Figure 2C:
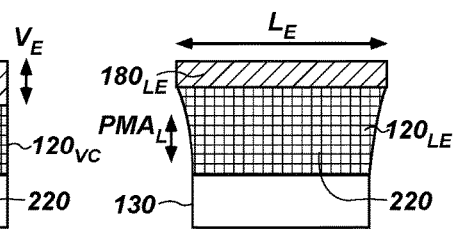
FIG. 2C is a partial, cross-sectional, elevational, schematic illustration of the magnetic cell structure of FIG. 2A in a switching configuration, the magnetic cell structure including a stressor structure configured to laterally expand during switching.

In other embodiments, the stressor structure 180 (FIG. 2A) may be configured to laterally expand under the conditions of a switching stage, e.g., when a programming current is passed through the magnetic cell core 101 (FIG. 1) and heats the stressor structure 180. In such embodiments, as illustrated in FIG. 2C, expansion in the direction indicated by arrow $L_E$ creates a laterally expanded stressor structure 180$_{LE}$ that exerts a lateral tensile force on the neighboring magnetic material 220. A resulting laterally expanded free region 120$_{LE}$ may exhibit a lowered PMA, as indicated by the lesser magnitude of arrow PMA$_L$ compared to the magnitude of arrow PMA of FIG. 2A. Thus, during switching, the programming current results in the laterally expanded stressor structure 180$_{LE}$, the laterally expanded free region 120$_{LE}$, and the lowered PMA$_L$. The lowered PMA$_L$ may enable switching of the magnetic orientation of the laterally expanded free region 120$_{LE}$ at a lower programming current than would otherwise be required.

Figure 3A:
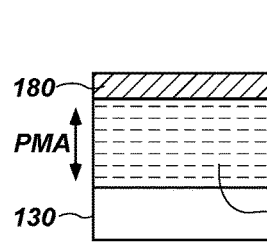
FIG. 3A is a partial, cross-sectional, elevational, schematic illustration of the magnetic cell structure of FIG. 1 in a storage configuration, the magnetic cell structure including a free region formed of a magnetic material having negative magnetostriction and a predominantly vertical magnetic orientation.
Figure 3B:
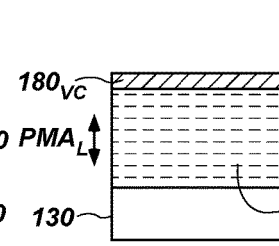
FIG. 3B is a partial, cross-sectional, elevational, schematic illustration of the magnetic cell structure of FIG. 3A in a switching configuration, the magnetic cell structure including a stressor structure configured to vertically contract during switching.
Figure 3C:
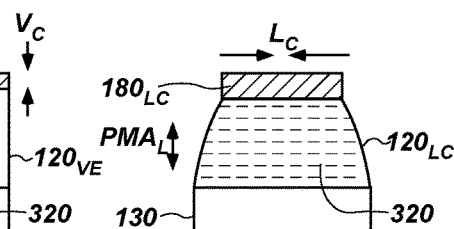
FIG. 3C is a partial, cross-sectional, elevational, schematic illustration of the magnetic cell structure of FIG. 3A in a switching configuration, the magnetic cell structure including a stressor structure configured to laterally contract during switching.

With reference to FIGS. 3A through 3C, illustrated is a free region 120 of the magnetic cell structure 100 of FIG. 1, wherein the free region 120 is formed of the magnetic material 320 having negative magnetostriction. In some embodiments, the stressor structure 180 may be configured to vertically contract, as indicated by arrow $V_C$, resulting in a vertically contracted stressor structure 180$_{VC}$ that exerts a vertical tensile stress upon the free region 120, resulting in a vertically expanded free region 120$_{VE}$. The magnetic material 320 of the vertically expanded free region 120$_{VE}$ may exhibit a lowered PMA$_L$. Therefore, the magnetic orientation of the vertically expanded free region 120$_{VE}$ may be switchable at a low programming current.

With reference to FIG. 3C, in other embodiments, the stressor structure 180 may be configured to laterally contract, as indicated by arrow $L_C$, resulting in a laterally contracted stressor structure 180$_{LC}$ that exerts a lateral compressive stress upon the free region 120, resulting in a laterally compressed free region 120$_{LC}$. The magnetic material 320 of the laterally compressed free region 120$_{LC}$ may exhibit a lowered PMA$_L$ with a magnetic orientation that may be switchable at a low programming current.

With reference to FIG. 4, illustrated is a magnetic cell structure 400 of an in-plane STT-MRAM cell in which the magnetic material of the fixed region 110 and the free region 120 in the magnetic cell core 401 exhibit horizontal magnetic orientation, as indicated by arrows 412 and double-pointed arrows 422.

With reference to FIG. 5A, in some embodiments, the free region 120 of the in-plane STT-MRAM cell may be formed of the magnetic material 320 exhibiting negative magnetostriction. The horizontal magnetic orientation exhibited by the magnetic material 320 may be characterized by the in-plane magnetic anisotropy ("IMA") strength. In some embodiments, the stressor structure 180 may be configured to vertically expand, in the direction of arrow $V_E$ of FIG. 5B, during switching, resulting in a vertically expanded stressor structure 180$_{VE}$ that exerts a vertical compressive stress upon the neighboring magnetic material 320, which results in vertically compressed free region 120$_{VC}$. The vertically compressed free region 120$_{VC}$ may, therefore, exhibit a lowered IMA$_L$ such that the magnetic orientation of the vertically compressed free region 120$_{VC}$ may be switchable at a low programming current. After switching, the vertically expanded stressor structure 180$_{VE}$ and the vertically compressed free region 120$_{VC}$ may return to the configuration illustrated in FIG. 5A.

With reference to FIG. 5C, in some embodiments, the stressor structure 180 may be configured to laterally expand, in the direction of arrow $L_E$, during switching, resulting in a laterally expanded stressor structure 180$_{LE}$ that exerts a lateral tensile stress upon the magnetic material 320, producing laterally expanded free region 120$_{LE}$. The laterally expanded free region 120$_{LE}$ may, therefore, exhibit a lowered IMA$_L$ such that the magnetic orientation of the laterally expanded free region 120$_{LE}$ may be switchable at a low programming current. After switching, the laterally expanded stressor structure $180_{LE}$ and the laterally expanded free region $120_{LE}$ may return to the configuration illustrated in FIG. 5A.

In other embodiments, the free region 120 (FIG. 4) of the magnetic cell core 401 of the in-plane STT-MRAM memory cell may be formed from the magnetic material 220 exhibiting positive magnetostriction, as illustrated in FIG. 6A. Thus, with reference to FIG. 6B, the stressor structure 180 may be configured to vertically contract during switching to exert a vertical tensile stress upon the free region 120, resulting in the vertically contracted stressor structure $180_{VC}$, the vertically expanded free region $120_{VE}$, and the lowered $IMA_L$. With reference to FIG. 6C, the stressor structure 180 may alternatively or additionally be configured to laterally contract during switching to exert a lateral compressive stress upon the free region 120, resulting in the laterally contracted stressor structure $180_{LC}$, the laterally compressed free region $120_{LC}$, and the lowered $IMA_L$. After switching, the regions and structures may return to the configuration illustrated in FIG. 6A.

Accordingly, disclosed is a memory cell comprising a magnetic cell core comprising a magnetic region and a stressor structure. The stressor structure is configured to exert a stress upon the magnetic region and to alter a magnetic anisotropy of the magnetic region when the stressor structure is subjected to a programming current passing through the magnetic cell core during switching of a magnetic orientation of the magnetic region.

Because the magnetic material 220 exhibiting positive magnetostriction reacts differently to vertical and lateral compressive and tensile stress produced by a neighboring stressor structure 180, it is contemplated that the stressor structure 180 be configured and oriented to exert the appropriate stress (e.g., vertical compressive (as in FIG. 2B), lateral tensile (as in FIG. 2C), vertical tensile (as in FIG. 3B), and lateral compressive (as in FIG. 3C)) to effect an increase in the MA strength of the magnetic material (e.g., the magnetic material 220 exhibiting positive magnetostriction, the magnetic material 320 exhibiting negative magnetostriction). In embodiments in which the magnetic region to be impacted by the stressor structure 180 is the free region 120, it is contemplated that the stressor structure 180 be configured to exert a stress that results in a lowering of the MA strength of the magnetic orientation exhibited by the free region 120.

Regardless of whether the STT-MRAM cell is configured as an out-of-plane cell (as in FIGS. 1 through 3C) or an in-plane cell (as in FIGS. 4 through 6C), whether the magnetic material of the magnetic region (e.g., the free region 120) is formed of the magnetic material 220 exhibiting positive magnetostriction or the magnetic material 320 exhibiting negative magnetostriction, and whether the stressor structure 180 is configured to vertically expand, vertically contract, laterally expand, or laterally contract, passing a programming current through the magnetic cell core (e.g., the magnetic cell core 101 (FIG. 1), the magnetic cell core 401 (FIG. 4)), during a switching stage, alters a magnetic orientation of the free region 120 and, therefore, alters an electrical resistance across the free region 120 and the fixed region 110 of the magnetic cell core (e.g., the magnetic cell core 101 (FIG. 1), the magnetic cell core 401 (FIG. 4)). Moreover, the alteration in at least one dimension of the stressor structure 180 is accomplished while the current is being passed through the magnetic cell core, and the alteration in the stressor structure 180 exerts the stress upon the neighboring magnetic region (e.g., the free region 120 or the fixed region 110) to alter the MA strength of the magnetic region.

Accordingly, disclosed is a method of operating a spin torque transfer magnetic random access memory (STT-MRAM) cell. The method comprises altering an electrical resistance across a magnetic region and another magnetic region of a magnetic cell core of the STT-MRAM cell to program a logic stage of the STT-MRAM cell. Altering the electrical resistance comprises passing a current through the magnetic cell core to switch a switchable magnetic orientation of the magnetic region. Responsive at least in part to passing the current, at least one dimension of a stressor structure, proximate to one of the magnetic region and the another magnetic region, is altered to exert a stress upon the one of the magnetic region and the another magnetic region and to alter a magnetic anisotropy of the one of the magnetic region and the another magnetic region.

With reference to FIG. 7, in some embodiments, a magnetic cell structure 700 may include a magnetic cell core 701 that includes an upper stressor structure 781 proximate to the free region 120 and a lower stressor structure 782 proximate to the fixed region 110. The upper stressor structure 781 may be configured like any of the stressor structures 180 described above with respect to FIGS. 1 through 3C. Thus, the upper stressor structure 781 may be configured to exert a stress upon the free region 120 during switching to lower the MA strength of the free region 120 during switching, enabling a lower programming current to be used during switching.

The lower stressor structure 782 may be disposed proximate to the fixed region 110 and may be configured to exert a stress upon the fixed region 110 during switching so as to alter an MA strength of the fixed region 110 during switching. It is contemplated that the lower stressor structure 782 may be configured to exert a stress that results in a higher (e.g., greater) MA strength in the fixed region 110. The higher MA strength may enable switching of the magnetic orientation of the free region 120, because the MA strength of the fixed region 110 may enhance the torque created as the programming current passes through the magnetic cell core 701.

The lower stressor structure 782 may also inhibit a decrease in magnetic anisotropy of the fixed region 110 during programming. For example, if the magnetic material of the fixed region 110 is apt to lower in MA strength when exposed to a temperature increase, then the stress exerted upon the fixed region 110 by the lower stressor structure 782 may inhibit the MA strength lowering.

With reference to FIG. 8A, in some embodiments, the fixed region 110 may be formed of the magnetic material 220 exhibiting positive magnetostriction and may exhibit a vertical magnetic orientation characterized by a PMA strength indicated by the magnitude of arrow PMA in FIG. 8A. So as to increase the PMA strength during switching, the lower stressor structure 782 may be configured to vertically contract, as indicated by arrow $V_C$ of FIG. 8B, during switching, which vertical contraction may exert a vertical tensile stress upon the magnetic material 220 exhibiting positive magnetostriction and so increase the PMA strength of the magnetic material 220. Therefore, during switching, the programming current may result in a vertically contracted stressor structure $782_{VC}$, a vertically expanded fixed region $110_{VE}$, and a higher $PMA_H$. After switching, the structure may return to the storage configuration illustrated in FIG. 8A.

Alternatively or additionally, the lower stressor structure 782 may be configured to laterally contract, in the direction of arrow $L_C$ of FIG. 8C. Lateral contraction results in a laterally contracted stressor structure $782_{LC}$ that exerts a lateral compressive stress upon the fixed region 110, resulting in a laterally compressed fixed region $110_{LC}$ that exhibits a higher $PMA_H$. After switching, the structure may return to the configuration illustrated in FIG. 8A.

With reference to FIG. 9A, in some embodiments, the fixed region 110 may be formed of the magnetic material 320 exhibiting negative magnetostriction. Thus, the lower stressor structure 782 may be configured to vertically expand, in the direction of arrow $V_E$ of FIG. 9B, to exert a vertical compressive stress on the magnetic material 320, resulting in a vertically compressed fixed region $110_{VC}$ exhibiting a higher $PMA_H$. In other embodiments, the lower stressor structure 782 may be configured to laterally expand, in the direction of arrow LE of FIG. 9C, to exert a lateral tensile stress on the magnetic material 320, resulting in a laterally expanded fixed region $110_{LE}$ exhibiting a higher $PMA_H$.

Figure 10A:
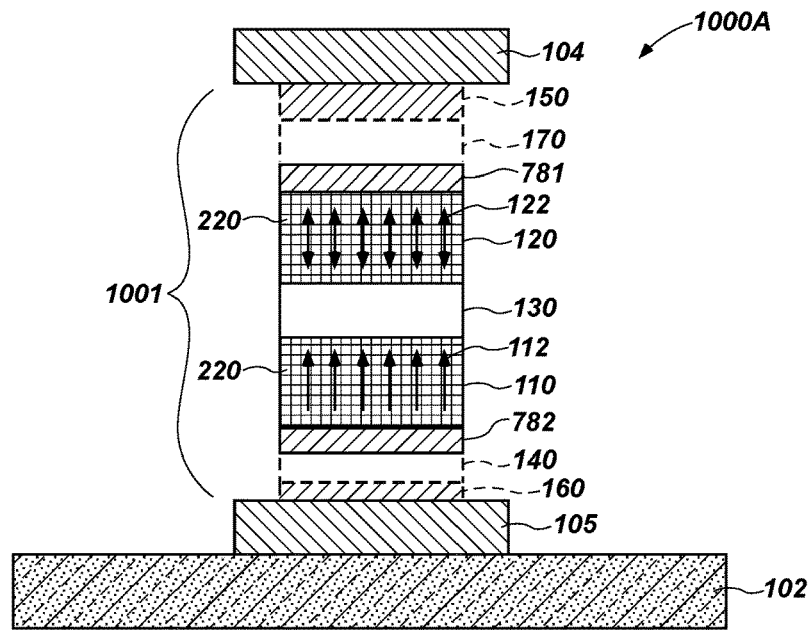
FIG. 10A is a cross-sectional, elevational, schematic illustration of a magnetic cell structure in a storage configuration, the magnetic cell structure including an upper stressor structure proximate to a free region and a lower stressor structure proximate to a fixed region of an out-of-plane STT-MRAM cell, the free region and the fixed region formed of magnetic materials having positive magnetostriction.
Figure 10B:
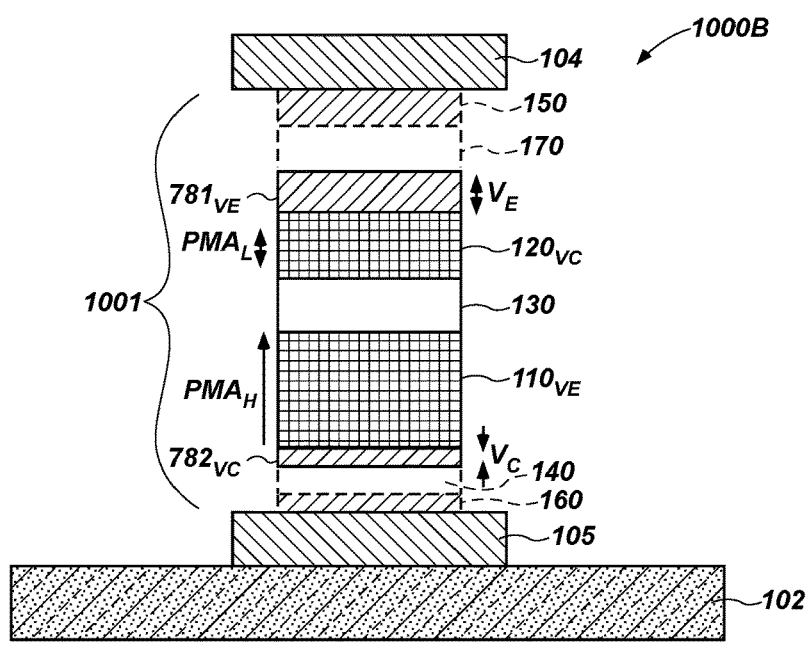
FIG. 10B is a cross-sectional, elevational, schematic illustration of the magnetic cell structure of FIG. 10A in a switching configuration, the upper stressor structure configured to vertically expand during switching, and the lower stressor structure configured to vertically contract during switching.

In some embodiments, both the fixed region 110 and the free region 120 may be formed of the magnetic material 220 exhibiting the positive magnetostriction. In such embodiments, the upper stressor structure 781 and the lower stressor structure 782 may be configured to oppositely change in at least one dimension during switching so as to lower the MA strength of the free region 120 and to increase the MA strength of the fixed region 110. For example, with reference to FIGS. 10A and 10B, a magnetic cell structure 1000A of an out-of-plane STT-MRAM cell may include a magnetic cell core 1001 having two magnetic regions formed of the magnetic material 220 exhibiting positive magnetostriction. FIG. 10A illustrates the magnetic cell structure 1000A in a storage configuration. The upper stressor structure 781 may be configured to vertically expand, compressing the free region 120, while the lower stressor structure 782 may be configured to vertically contract, expanding the fixed region 110. Thus, as illustrated in FIG. 10B, the resulting vertically compressed free region $120_{VC}$ may exhibit a lowered $PMA_L$, while the vertically expanded fixed region $110_{VE}$ may exhibit a higher $PMA_H$, in magnetic cell structure 1000B, compared to the PMA strengths of the respective regions of the magnetic cell structure 1000A of FIG. 10A.

Figure 11A:
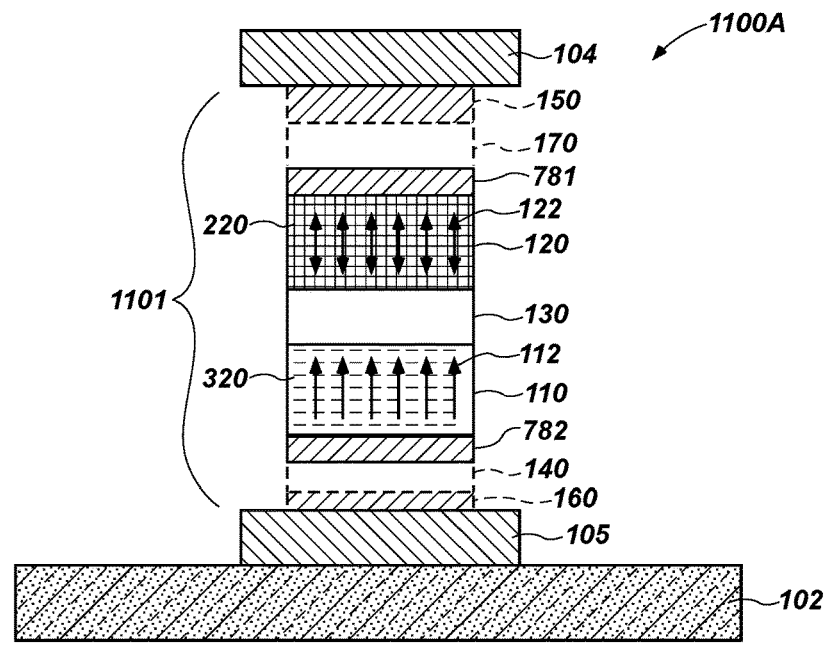
FIG. 11A is a cross-sectional, elevational, schematic illustration of a magnetic cell structure in a storage configuration, the magnetic cell structure including an upper stressor structure proximate to a free region and a lower stressor structure proximate to a fixed region of an out-of-plane STT-MRAM cell, the free region formed of a magnetic material having positive magnetostriction and the fixed region formed of a magnetic material having negative magnetostriction.
Figure 11B:
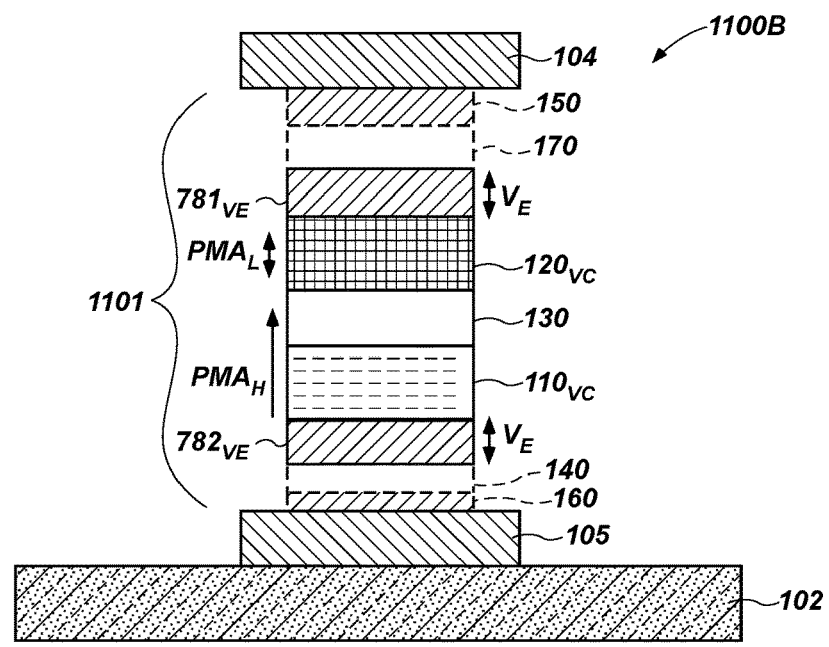
FIG. 11B is a cross-sectional, elevational, schematic illustration of the magnetic cell structure of FIG. 11A in a switching configuration, the upper stressor structure and the lower stressor structure configured to vertically expand during switching.

In other embodiments, both the upper stressor structure 781 and the lower stressor structure 782 may be configured to alter in the same dimension, and the fixed region 110 and the free region 120 may be formed of oppositely magnetostrictive materials. For example, with reference to FIGS. 11A and 11B, a magnetic cell structure 1100A of an out-of-plane STT-MRAM cell may include a magnetic cell core 1101 having a free region 120 formed from the magnetic material 220 exhibiting positive magnetostriction and fixed region 110 formed of the magnetic material 320 exhibiting negative magnetostriction. Both the upper stressor structure 781 and the lower stressor structure 782 may be configured to vertically expand, contracting the free region 120 and the fixed region 110. Thus, as illustrated in FIG. 11B, the resulting vertically compressed free region $120_{VC}$ may exhibit the lowered $PMA_L$, while the vertically compressed fixed region $110_{VC}$ may exhibit a higher $PMA_H$, in magnetic cell structure 1100B, compared to the PMA strength of the respective regions of the magnetic cell structure 1100A of FIG. 11A. In such embodiments, the upper stressor structure 781 and the lower stressor structure 782 may be formed from the same material.

Figure 12:
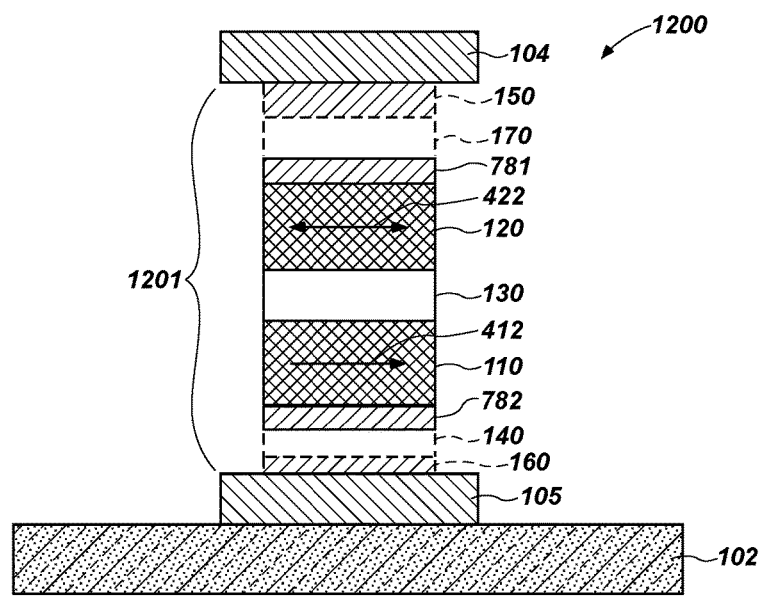
FIG. 12 is a cross-sectional, elevational, schematic illustration of a magnetic cell structure including an upper stressor structure proximate to a free region and a lower stressor structure proximate to a fixed region of an in-plane STT-MRAM cell.

More than one stressor structure (e.g., an upper stressor structure 781 and a lower stressor structure 782) may also be included in embodiments in which the STT-MRAM cell is configured as an in-plane cell. With reference to FIG. 12, for example, a magnetic cell structure 1200 may include a magnetic cell core 1201 having an upper stressor structure 781 proximate to the free region 120 and a lower stressor structure 782 proximate to a fixed region 110. The upper stressor structure 781 may be configured like any of the stressor structures 180 described above with respect to FIGS. 4 through 6C.

Figure 13A:
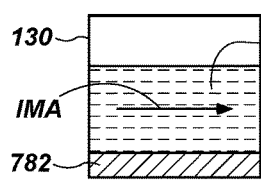
FIG. 13A is a partial, cross-sectional, elevational, schematic illustration of the magnetic cell structure of FIG. 12 in a storage configuration, the magnetic cell structure including a fixed region formed of a magnetic material having negative magnetostriction and a predominantly horizontal magnetic orientation.
Figure 13B:
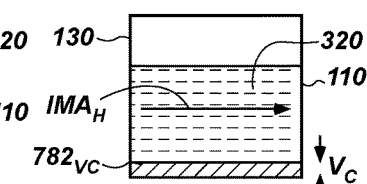
FIG. 13B is a partial, cross-sectional, elevational, schematic illustration of the magnetic cell structure of FIG. 13A in a switching configuration, the magnetic cell structure including a lower stressor structure configured to vertically contract during switching.
Figure 13C:
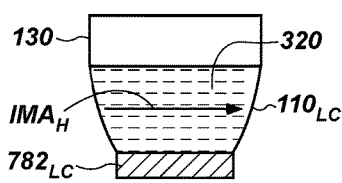
FIG. 13C is a partial, cross-sectional, elevational, schematic illustration of the magnetic cell structure of FIG. 13A in a switching configuration, the magnetic cell structure including a lower stressor structure configured to laterally contract during switching.

In some embodiments, the fixed region 110 may be formed of the magnetic material 320 exhibiting negative magnetostriction, as illustrated in FIG. 13A. Therefore, the lower stressor structure 782 may be configured to vertically contract, in the direction of arrow $V_C$ of FIG. 13B, to exert a vertical tensile stress upon the fixed region 110, resulting in a vertically expanded fixed region $110_{VE}$ having a higher $IMA_H$ compared to the structure of FIG. 13A. Alternatively or additionally, the lower stressor structure 782 may be configured to laterally contract, in the direction of arrow $L_C$ of FIG. 13C, to exert a lateral compressive stress upon the fixed region 110, resulting in a laterally compressed free region $110_{LC}$ having a higher $IMA_H$ compared to the structure of FIG. 13A.

Figure 14A:
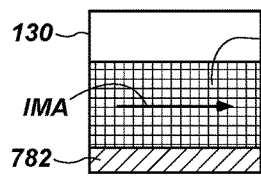
FIG. 14A is a partial, cross-sectional, elevational, schematic illustration of the magnetic cell structure of FIG. 12 in a storage configuration, the magnetic cell structure including a fixed region formed of a magnetic material having positive magnetostriction and a predominantly horizontal magnetic orientation.
Figure 14B:
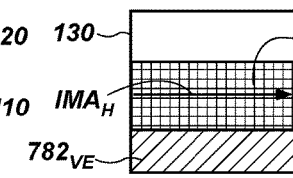
FIG. 14B is a partial, cross-sectional, elevational, schematic illustration of the magnetic cell structure of FIG. 14A in a switching configuration, the magnetic cell structure including a lower stressor structure configured to vertically expand during switching.
Figure 14C:
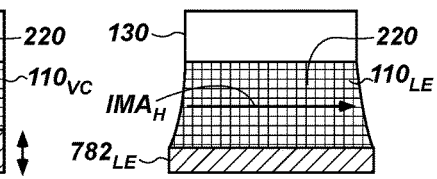
FIG. 14C is a partial, cross-sectional, elevational, schematic illustration of the magnetic cell structure of FIG. 14A in a switching configuration, the magnetic cell structure including a lower stressor structure configured to laterally expand during switching.

In other embodiments, the fixed region 110 may be formed of the magnetic material 220 exhibiting positive magnetostriction, as illustrated in FIG. 14A. Therefore, the lower stressor structure 782 may be configured to vertically expand, in the direction of arrow $V_E$ of FIG. 14B, to exert a vertical compressive stress upon the fixed region 110, resulting in a vertically compressed fixed region $110_{VC}$ having a higher $IMA_H$ compared to the structure of FIG. 14A. Alternatively or additionally, the lower stressor structure 782 may be configured to laterally expand, in the direction of arrow $L_E$ of FIG. 14C, and the resulting laterally expanded stressor structure $782_{LE}$ may exert a lateral tensile stress upon the fixed region 110, resulting in a laterally expanded fixed region $110_{LE}$ having a higher $IMA_H$ compared to the structure of 14A.

Figure 15A:
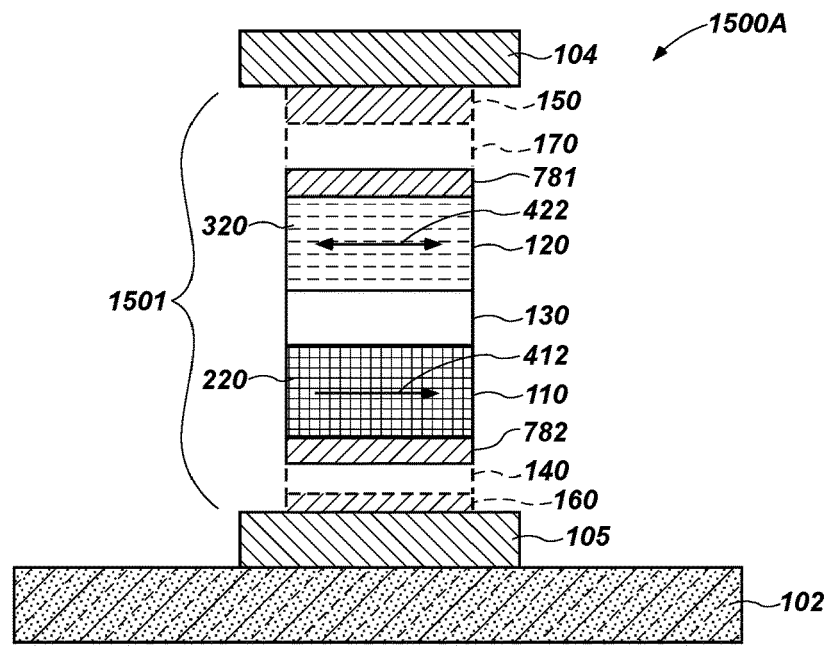
FIG. 15A is a cross-sectional, elevational, schematic illustration of a magnetic cell structure in a storage configuration, the magnetic cell structure including an upper stressor structure proximate to a free region and a lower stressor structure proximate to a fixed region of an in-plane STT-MRAM cell, the free region formed of a magnetic material having negative magnetostriction and the fixed region formed of a magnetic material having positive magnetostriction.
Figure 15B:
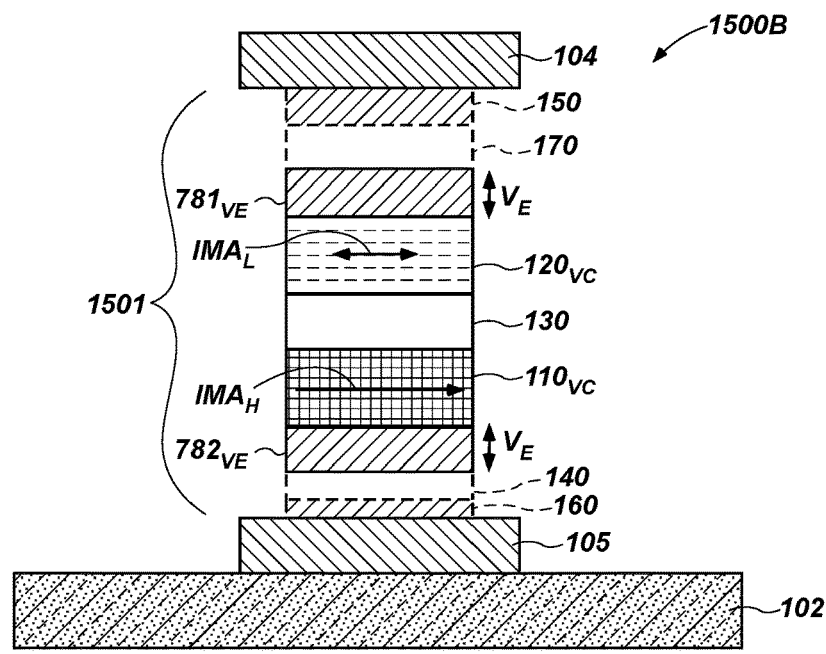
FIG. 15B is a cross-sectional, elevational, schematic illustration of the magnetic cell structure of FIG. 15A in a switching configuration, the upper stressor structure and the lower stressor structure configured to vertically expand during switching.

In some embodiments, both the upper stressor structure 781 and the lower stressor structure 782 may be configured to vertically expand during switching while the free region 120 and the fixed region 110 may be formed of magnetic materials exhibiting opposite magnetostriction. For example, as illustrated in FIGS. 15A and 15B, a magnetic cell structure 1500A of an in-plane STT-MRAM cell may include a magnetic cell core 1501 having a free region 120 formed of the magnetic material 320 exhibiting negative magnetostriction and a fixed region 110 formed of the magnetic material 220 exhibiting positive magnetostriction while both the upper stressor structure 781 and the lower stressor structure 782 may be configured to vertically expand in the direction of arrows $V_E$ of FIG. 15B. Therefore, during switching, the resulting vertically expanded stressor structure $781_{VE}$ and the vertically expanded stressor structure $782_{VE}$ exert vertical compressive stresses upon the magnetic material 320, and 220, respectively, resulting in the vertically compressed free region $120_{VC}$ exhibiting a lowered $IMA_L$ and the vertically compressed fixed region $110_{VC}$ exhibiting a higher $IMA_H$ in magnetic cell structure 1500B.

Figure 16A:
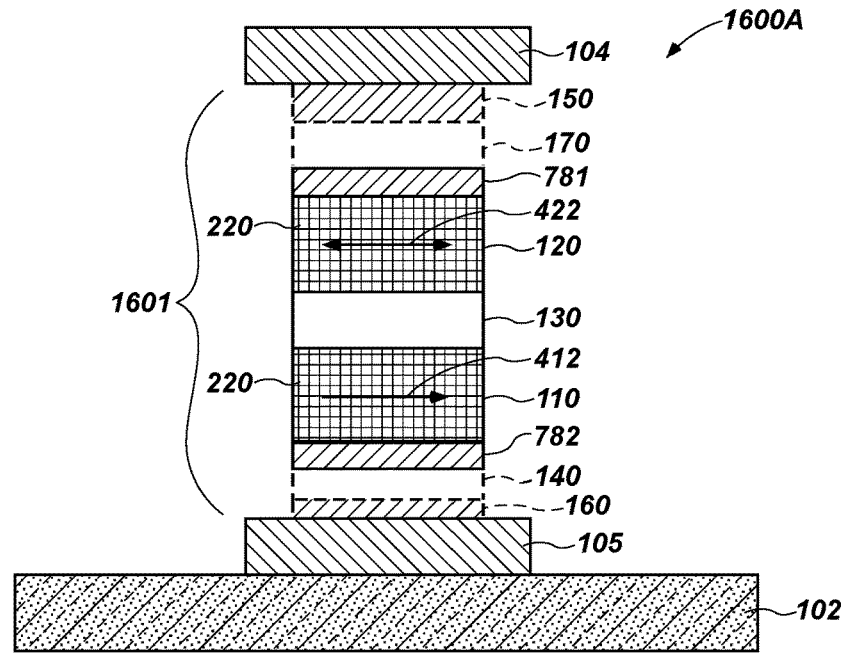
FIG. 16A is a cross-sectional, elevational, schematic illustration of a magnetic cell structure in a storage configuration, the magnetic cell structure including an upper stressor structure proximate to a free region and a lower stressor structure proximate to a fixed region of an in-plane STT-MRAM cell, the free region and the fixed region formed of a magnetic material having positive magnetostriction.
Figure 16B:
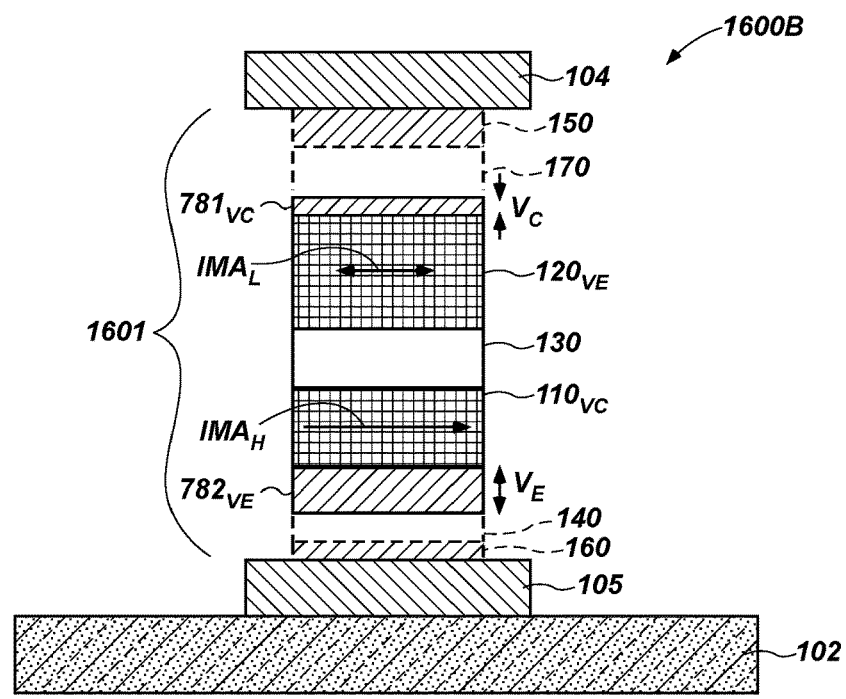
FIG. 16B is a cross-sectional, elevational, schematic illustration of the magnetic cell structure of FIG. 16A in a switching configuration, the upper stressor structure configured to vertically contract during switching and the lower stressor structure configured to vertically expand during switching.

In other embodiments, the magnetic material 220 exhibiting positive magnetostriction or the magnetic material 320 exhibiting negative magnetostriction is utilized to form both the fixed region 110 and the free region 120, while the upper stressor structure 781 and the lower stressor structure 782 are configured to be oppositely altered in dimension during switching. For example, as illustrated in FIGS. 16A and 16B, a magnetic cell structure 1600A of an in-plane STT-MRAM cell may include a magnetic cell core 1601 having a fixed region 110 and a free region 120 formed of the magnetic material 220 exhibiting positive magnetostriction. The upper stressor structure 781 may be configured to vertically contract, in the direction of arrow $V_C$ of FIG. 16B, resulting in a vertically contracted stressor structure $781_{VC}$, while the lower stressor structure 782 may be configured to vertically expand, in the direction of arrow $V_E$, resulting in the vertically expanded free region $120_{VE}$ of magnetic cell structure 1600B having a lowered $IMA_L$ and the vertically compressed fixed region $110_{VC}$ having a higher $IMA_H$.

Accordingly, disclosed is a memory cell comprising a magnetic cell core. The magnetic cell core comprises a free region configured to exhibit a switchable magnetic orientation. The magnetic cell core also comprises a fixed region configured to exhibit a fixed magnetic orientation. A non-magnetic region is disposed between the free region and the fixed region. A stressor structure, proximate to the free region, is configured to change in size during switching of the switchable magnetic orientation to exert a stress upon the free region during switching. Another stressor structure, proximate to the fixed region, is configured to change in size during switching of the switchable magnetic orientation to exert a stress upon the fixed region during switching.

With respect to any of the embodiments in which more than one stressor structure is included in the magnetic cell core, it is contemplated that the stressor structure configured to exert a stress upon the free region 120 (e.g., the upper stressor structure 781) may be configured to exert a stress that will result in a lowered MA of the free region 120 while the stressor structure configured to exert a stress upon the fixed region 110 (e.g., the lower stressor structure 782) may be configured to exert a stress that will result in a higher MA of the fixed region 110. However, it is also contemplated that, in other embodiments, it may be desirable to increase the MA strength of both the fixed region 110 and the free region 120 or to decrease the MA strength of both the free region 120 and the fixed region 110. In such embodiments, the magnetic material from which the magnetic regions are formed may be selected to have an appropriate magnetostriction (e.g., either positive or negative) and the stressor structures (e.g., the upper stressor structure 781 and the lower stressor structure 782) configured to vertically expand, vertically contract, laterally expand, laterally contract, or any combination thereof to impart the appropriate stress (e.g., vertical tensile, vertical compressive, lateral tensile, lateral compressive, or any combination thereof, respectively) to effect the desired alteration in the MA strength of the magnetic material.

In some embodiments, the stressor structure (e.g., any of the stressor structure 180 (FIGS. 1 through 6C), the upper stressor structure 781 (FIGS. 7 through 16B), and the lower stressor structure 782 (FIGS. 7 through 16B)) may be configured as a multi-region stressor structure 1780 with multiple stressor sub-regions 1781, as illustrated in FIG. 17. Each of the upper stressor structures 781 may be formed of a different material or of the same material in different discrete regions overlying one another or arranged side-by-side so as to form the multi-region stressor structure 1780 configured to alter in at least one dimension during switching.

In some embodiments, the stressor structure (e.g., any of the stressor structures 180 (FIGS. 1 through 6C), the upper stressor structure 781 (FIGS. 7 through 16B), and the lower stressor structure 782 (FIGS. 7 through 16B)) may be formed as a continuous, uniform region proximate to one of the fixed region 110 and the free region 120. However, in other embodiments, such as that illustrated in FIG. 18, the stressor structure (e.g., any of the stressor structures 180 (FIGS. 1 through 6C), the upper stressor structure 781 (FIGS. 7 through 16B), and the lower stressor structure 782 (FIGS. 7 through 16B)) may be configured as a discontinuous stressor structure 1880, with multiple discrete stressor features 1881 separated from one another by spaces 1882. In such embodiments, each of the discrete stressor features 1881 may be configured to alter in at least one dimension during switching to as to exert a stress upon neighboring magnetic material.

In some embodiments, the stressor structure (e.g., any of the stressor structure 180 (FIGS. 1 through 6C), the upper stressor structure 781 (FIGS. 7 through 16B), and the lower stressor structure 782 (FIGS. 7 through 16B)) may be disposed directly on a magnetic region (e.g., the fixed region 110 or the free region 120). In such embodiments, expansion or contraction of the stressor structure (e.g., any of the stressor structure 180 (FIGS. 1 through 6C), the upper stressor structure 781 (FIGS. 7 through 16B), and the lower stressor structure 782 (FIGS. 7 through 16B)) may exert a stress directly upon the neighboring magnetic region.

In other embodiments, such as that illustrated in FIG. 19, an intermediate structure 1990 may be disposed between the stressor structure 180 and the neighboring magnetic material (e.g., the free region 120). In some such embodiments, the stressor structure 180 may be between the oxide capping region 170 and the intermediate structure 1990. In other such embodiments, the oxide capping region 170 may be between the stressor structure 180 and the free region 120 so that the oxide capping region 170 serves as the intermediate structure 1990. Thus, the stressor structure 180 may be between the oxide capping region 170 and the upper intermediary regions 150 (FIG. 1). If the upper intermediary regions 150 (FIG. 1) are not included, the stressor structure 180 may be between the oxide capping region 170 and the upper electrode 104 (FIG. 1). Accordingly, stress exerted by the stressor structure 180 on the magnetic material may be imparted via the intermediate structure 1990.

In some embodiments, the magnetic cell core (e.g., the magnetic cell core 101 (FIG. 1), the magnetic cell core 401 (FIG. 4), the magnetic cell core 701 (FIG. 7), the magnetic cell core 1001 (FIGS. 10A and 10B), the magnetic cell core 1101 (FIGS. 11A and 11B), the magnetic cell core 1201 (FIG. 12), the magnetic cell core 1501 (FIGS. 15A and 15B), and the magnetic cell core 1601 (FIGS. 16A and 16B)) may also include a heater structure 2090, as illustrated in FIG. 20. The heater structure 2090 may be formed from, for example and without limitation, metal oxides, metal nitrides, metal oxynitrides, or any combination thereof. The heater structure 2090 may be configured to transfer heat either to or from the stressor structure 180 so as to enhance the alteration of the stressor structure 180 during switching. For example, in embodiments in which the stressor structure 180 is configured to expand, the heater structure 2090 may be configured to transfer heat to the stressor structure 180 to expand the stressor structure 180 during switching even more than it would otherwise expand in the absence of the heater structure 2090. In embodiments in which the stressor structure 180 is configured to contract, the heater structure 2090 may be configured to cool the stressor structure 180, such that heat transfers from the stressor structure 180 to the heater structure 2090, to contract the stressor structure 180 during switching even more than it would otherwise contract in the absence of the heater structure 2090. As such, the heater structure 2090 may be operably connected to a heating element or a cooling element to enable the heat exchange between the heater structure 2090 and the stressor structure 180.

It should be noted that while the figures illustrate the free region 120 to be disposed above the fixed region 110, the free region 120 and the fixed region 110 may be otherwise disposed relative to one another. For example, any of the magnetic cell cores (e.g., the magnetic cell core 101 (FIG. 1), the magnetic cell core 401 (FIG. 4), the magnetic cell core 701 (FIG. 7), the magnetic cell core 1001 (FIGS. 10A and 10B), the magnetic cell core 1101 (FIGS. 11A and 11B), the magnetic cell core 1201 (FIG. 12), the magnetic cell core 1501 (FIGS. 15A and 15B), and the magnetic cell core 1601 (FIGS. 16A and 16B)) may be inverted between the upper electrode 104 and the lower electrode 105 and still be within the scope of the present disclosure.

The materials of the magnetic cell structure (e.g., the magnetic cell structure 100 (FIG. 1), the magnetic cell structure 400 (FIG. 4), the magnetic cell structure 700 (FIG. 7), the magnetic cell structure 1000A (FIG. 10A), the magnetic cell structure 1100A (FIG. 11A), the magnetic cell structure 1200 (FIG. 12), the magnetic cell structure 1500A (FIG. 15A), and the magnetic cell structure 1600A (FIG. 16A)) may be sequentially formed, one on top of the other, from base to top and then patterned to form the structures, with the lower electrode 105 and the upper electrode 104 formed therebelow and thereabove. Methods for forming and patterning the materials of the regions and structures, as described above, are well known in the art and are not discussed in detail herein.

Accordingly, disclosed is a method of forming a memory cell. The method comprises forming a magnetic material over a substrate. A nonmagnetic material is formed over the magnetic material, and another magnetic material is formed over the nonmagnetic material. A stressor material is formed proximate to at least one of the magnetic material and the another magnetic material. The stressor material has a coefficient of thermal expansion differing from a coefficient of thermal expansion of a nearest one of the magnetic material and the another magnetic material.

With reference to FIG. 21, illustrated is an STT-MRAM system 2100 that includes peripheral devices 2112 in operable communication with an STT-MRAM cell 2114, a grouping of which may be fabricated to form an array of memory cells in a grid pattern including a number of rows and columns, or in various other arrangements, depending on the system requirements and fabrication technology. The STT-MRAM cell 2114 includes a magnetic cell core 2102, an access transistor 2103, a conductive material that may function as a data/sense line 2104 (e.g., a bit line), a conductive material that may function as an access line 2105 (e.g., a word line), and a conductive material that may function as a source line 2106. The peripheral devices 2112 of the STT-MRAM system 2100 may include read/write circuitry 2107, a bit line reference 2108, and a sense amplifier 2109. The cell core 2102 may be any one of the magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B)) described above. Due to the structure of the cell core 2102, i.e., the inclusion of at least one stressor structure 180, 781, 782) an MA strength of a magnetic region within the cell core 2102 may be altered during switching, e.g., to enable use of a lower switching current.

In use and operation, when an STT-MRAM cell 2114 is selected to be programmed, a programming current is applied to the STT-MRAM cell 2114, and the current is spin-polarized by the fixed region of the cell core 2102 and exerts a torque on the free region of the cell core 2102, which switches the magnetization of the free region to "write to" or "program" the STT-MRAM cell 2114. In a read operation of the STT-MRAM cell 2114, a current is used to detect the resistance state of the cell core 2102.

To initiate programming of the STT-MRAM cell 2114, the read/write circuitry 2107 may generate a write current (i.e., a programming current) to the data/sense line 2104 and the source line 2106. The polarity of the voltage between the data/sense line 2104 and the source line 2106 determines the switch in magnetic orientation of the free region in the cell core 2102. By changing the magnetic orientation of the free region with the spin polarity, the free region is magnetized according to the spin polarity of the programming current, the programmed logic state is written to the STT-MRAM cell 2114.

To read the STT-MRAM cell 2114, the read/write circuitry 2107 generates a read voltage to the data/sense line 2104 and the source line 2106 through the cell core 2102 and the access transistor 2103. The programmed state of the STT-MRAM cell 2114 relates to the electrical resistance across the cell core 2102, which may be determined by the voltage difference between the data/sense line 2104 and the source line 2106. In some embodiments, the voltage difference may be compared to the bit line reference 2108 and amplified by the sense amplifier 2109.

FIG. 21 illustrates one example of an operable STT-MRAM system 2100. It is contemplated, however, that the magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B)) may be incorporated and utilized within any STT-MRAM system configured to incorporate a magnetic cell core having magnetic regions.

Accordingly, disclosed is a spin torque transfer magnetic random access memory (STT-MRAM) system comprising a magnetic cell core comprising a stressor structure proximate to a magnetic region. The stressor structure is configured to exert a stress upon the magnetic region in response to a current passed through the stressor structure in the magnetic cell core during switching to alter an electrical resistance across the magnetic region. The STT-MRAM system also comprises conductive materials in operable communication with the magnetic cell core.

Figure 22:
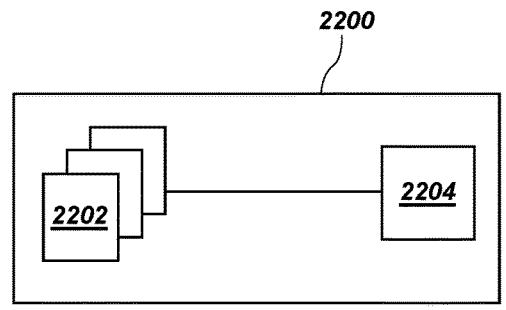
FIG. 22 is a simplified block diagram of a semiconductor device structure including memory cells having a magnetic cell structure according to an embodiment of the present disclosure.

With reference to FIG. 22, illustrated is a simplified block diagram of a semiconductor device 2200 implemented according to one or more embodiments described herein. The semiconductor device 2200 includes a memory array 2202 and a control logic component 2204. The memory array 2202 may include a plurality of the STT-MRAM cells 2114 (FIG. 21) including any of the magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B)) discussed above, which magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B) may have been formed according to a method described above and may be operated according to a method described above. The control logic component 2204 may be configured to operatively interact with the memory array 2202 so as to read from or write to any or all memory cells (e.g., STT-MRAM cell 2114 (FIG. 21)) within the memory array 2202.

Accordingly, disclosed is a semiconductor device comprising a spin torque transfer magnetic random access memory (STT-MRAM) array comprising STT-MRAM cells. An STT-MRAM cell of the STT-MRAM cells comprises a magnetic cell core. The magnetic cell core comprises a nonmagnetic region between a magnetic region and another magnetic region. The magnetic cell core also comprises a stressor structure proximate to the magnetic region. The stressor structure has a different coefficient of thermal expansion than the magnetic region and is configured to alter in at least one dimension and exert a stress upon the magnetic region when subjected to a programming current during switching of the STT-MRAM cell to alter a magnetic anisotropy of the magnetic region.

Figure 23:
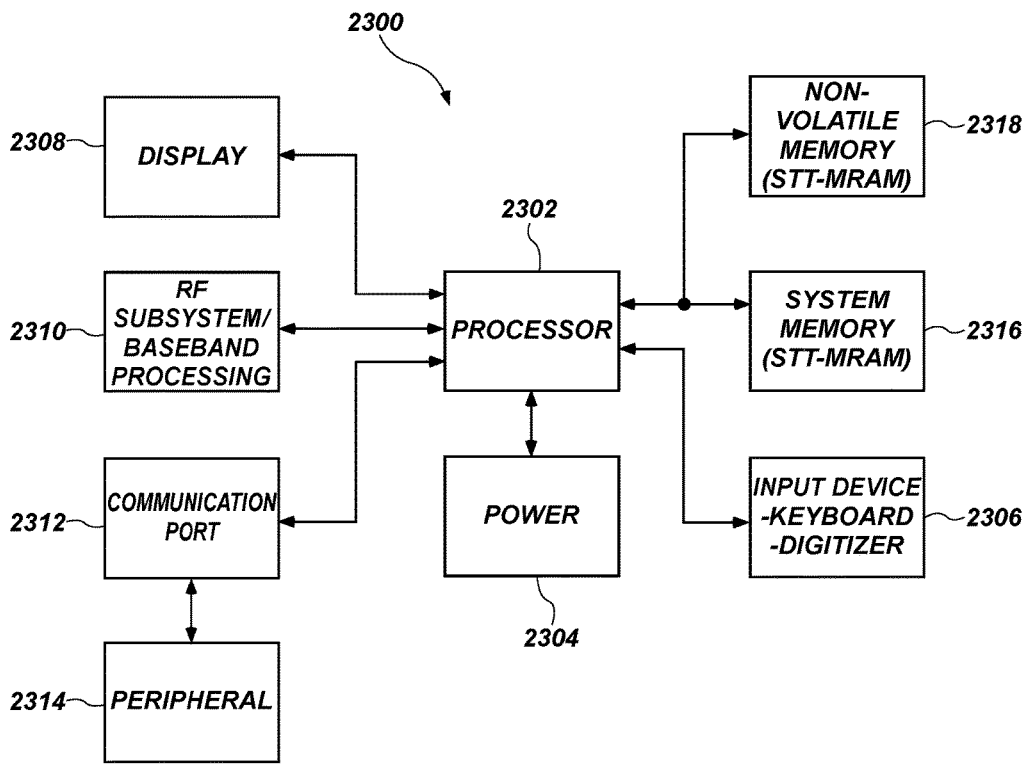
FIG. 23 is a simplified block diagram of a system implemented according to one or more embodiments of the present disclosure.

With reference to FIG. 23, depicted is a processor-based system 2300. The processor-based system 2300 may include various electronic devices manufactured in accordance with embodiments of the present disclosure. The processor-based system 2300 may be any of a variety of types such as a computer, pager, cellular phone, personal organizer, control circuit, or other electronic device. The processor-based system 2300 may include one or more processors 2302, such as a microprocessor, to control the processing of system functions and requests in the processor-based system 2300. The processor 2302 and other subcomponents of the processor-based system 2300 may include magnetic memory devices manufactured in accordance with embodiments of the present disclosure.

The processor-based system 2300 may include a power supply 2304. For example, if the processor-based system 2300 is a portable system, the power supply 2304 may include one or more of a fuel cell, a power scavenging device, permanent batteries, replaceable batteries, and rechargeable batteries. The power supply 2304 may also include an AC adapter; therefore, the processor-based system 2300 may be plugged into a wall outlet, for example. The power supply 2304 may also include a DC adapter such that the processor-based system 2300 may be plugged into a vehicle cigarette lighter or a vehicle power port, for example.

Various other devices may be coupled to the processor 2302 depending on the functions that the processor-based system 2300 performs. For example, a user interface 2306 may be coupled to the processor 2302. The user interface 2306 may include input devices such as buttons, switches, a keyboard, a light pen, a mouse, a digitizer and stylus, a touch screen, a voice recognition system, a microphone, or a combination thereof. A display 2308 may also be coupled to the processor 2302. The display 2308 may include an LCD display, an SED display, a CRT display, a DLP display, a plasma display, an OLED display, an LED display, a three-dimensional projection, an audio display, or a combination thereof. Furthermore, an RF sub-system/baseband processor 2310 may also be coupled to the processor 2302. The RF sub-system/baseband processor 2310 may include an antenna that is coupled to an RF receiver and to an RF transmitter (not shown). A communication port 2312, or more than one communication port 2312, may also be coupled to the processor 2302. The communication port 2312 may be adapted to be coupled to one or more peripheral devices 2314, such as a modem, a printer, a computer, a scanner, or a camera, or to a network, such as a local area network, remote area network, intranet, or the Internet, for example.

The processor 2302 may control the processor-based system 2300 by implementing software programs stored in the memory. The software programs may include an operating system, database software, drafting software, word processing software, media editing software, or media playing software, for example. The memory is operably coupled to the processor 2302 to store and facilitate execution of various programs. For example, the processor 2302 may be coupled to system memory 2316, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 2316 may include volatile memory, non-volatile memory, or a combination thereof. The system memory 2316 is typically large so that it can store dynamically loaded applications and data. In some embodiments, the system memory 2316 may include semiconductor devices, such as the semiconductor device 2200 of FIG. 22, memory cells including any of magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B)), or a combination thereof.

The processor 2302 may also be coupled to non-volatile memory 2318, which is not to suggest that system memory 2316 is necessarily volatile. The non-volatile memory 2318 may include one or more of STT-MRAM, MRAM, read-only memory (ROM) such as an EPROM, resistive read-only memory (RROM), and Flash memory to be used in conjunction with the system memory 2316. The size of the non-volatile memory 2318 is typically selected to be just large enough to store any necessary operating system, application programs, and fixed data. Additionally, the non-volatile memory 2318 may include a high capacity memory such as disk drive memory, such as a hybrid-drive including resistive memory or other types of non-volatile solid-state memory, for example. The non-volatile memory 2318 may include semiconductor devices, such as the semiconductor device 2200 of FIG. 22, memory cells including any of magnetic cell cores (e.g., magnetic cell core 101 (FIG. 1), magnetic cell core 401 (FIG. 4), magnetic cell core 701 (FIG. 7), magnetic cell core 1001 (FIGS. 10A and 10B), magnetic cell core 1101 (FIGS. 11A and 11B), magnetic cell core 1201 (FIG. 12), magnetic cell core 1501 (FIGS. 15A and 15B), and magnetic cell core 1601 (FIGS. 16A and 16B)), or a combination thereof.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:
    a magnetic structure between a lower electrode and an upper electrode, the magnetic structure comprising:
        a nonmagnetic region between a magnetic region and another magnetic region; and
        a stressor structure directly contacting a surface of the magnetic region parallel with an interface between the magnetic structure and the lower electrode, the stressor structure configured to vertically contract or vertically expand and to exert a stress upon the magnetic region when the stressor structure is subjected to an electrical current passing through the magnetic structure, the magnetic region configured to alter in size responsive to the stress exerted by the stressor structure to alter a magnetic anisotropy exhibited by the magnetic region.

2. The semiconductor device of claim 1, wherein:
the magnetic region exhibits a switchable magnetic orientation; and
the magnetic region is configured to alter in size responsive to the stress exerted by the stressor structure to decrease the magnetic anisotropy exhibited by the magnetic region.

3. The semiconductor device of claim 2, wherein:
the switchable magnetic orientation exhibited by the magnetic region is a vertical switchable magnetic orientation;
the magnetic region comprises a magnetic material having positive magnetostriction; and
the magnetic region is configured to vertically contract responsive to the stress exerted by the stressor structure.

4. The semiconductor device of claim 2, wherein:
the switchable magnetic orientation exhibited by the magnetic region is a vertical switchable magnetic orientation;
the magnetic region comprises a magnetic material having negative magnetostriction; and
the magnetic region is configured to vertically expand responsive to the stress exerted by the stressor structure.

5. The semiconductor device of claim 2, wherein:
the switchable magnetic orientation exhibited by the magnetic region is a horizontal switchable magnetic orientation;
the magnetic region comprises a magnetic material having negative magnetostriction; and
the magnetic region is configured to vertically contract responsive to the stress exerted by the stressor structure.

6. The semiconductor device of claim 2, wherein:
the switchable magnetic orientation exhibited by the magnetic region is a horizontal switchable magnetic orientation;
the magnetic region comprises a magnetic material having positive magnetostriction; and
the magnetic region is configured to vertically expand responsive to the stress exerted by the stressor structure.

7. The semiconductor device of claim 1, wherein:
the magnetic region exhibits a fixed magnetic orientation; and
the magnetic region is configured to alter in size responsive to the stress exerted by the stressor structure to increase the magnetic anisotropy exhibited by the magnetic region.

8. A semiconductor device, comprising:
a magnetic tunnel junction structure, comprising:
magnetic regions, comprising:
a free region exhibiting a switchable magnetic orientation; and
a fixed region exhibiting a fixed magnetic orientation;
a nonmagnetic oxide region between the free region and the fixed region; and
a stressor structure extending over a horizontal surface of one of the magnetic regions and directly contacting the magnetic tunnel junction structure, the stressor structure configured to expand or to contract, responsive to passage of a current through the stressor structure, to exert a stress upon one of the magnetic regions,
the one of the magnetic regions configured to vertically contract, responsive to the stress exerted by the stressor structure, to increase a magnetic anisotropy in a direction of predominant magnetic orientation exhibited by the one of the magnetic regions, the one of the magnetic regions comprising a magnetic material having a negative magnetostriction and exhibiting a vertical magnetic orientation.

9. A method of operating a semiconductor device comprising a magnetic structure between a lower electrode and an upper electrode, the magnetic structure comprising a stressor structure directly contacting a surface of a magnetic region parallel with an interface between the magnetic structure and the lower electrode, the method comprising:
passing a current between the lower electrode and the upper electrode and through the magnetic structure to alter a size of the stressor structure in a vertical direction to exert a stress upon the magnetic region to alter a size of the magnetic region; and
halting the passage of the current, the stressor structure and the magnetic region reverting in size in the absence of the current.

10. The method of claim 9, wherein passing the current through the magnetic structure comprises switching a magnetic orientation exhibited by the magnetic region.

11. A semiconductor device, comprising:
a magnetic tunnel junction structure, comprising:
magnetic regions, comprising:
a free region exhibiting a switchable magnetic orientation; and
a fixed region exhibiting a fixed magnetic orientation;
a nonmagnetic oxide region between the free region and the fixed region; and
a stressor structure extending over a horizontal surface of one of the magnetic regions and directly contacting the magnetic tunnel junction structure, the stressor structure configured to expand or to contract, responsive to passage of a current through the stressor structure, to exert a stress upon one of the magnetic regions,
the one of the magnetic regions configured to laterally expand, responsive to the stress exerted by the stressor structure, to increase a magnetic anisotropy in a direction of predominant magnetic orientation exhibited by the one of the magnetic regions, the one of the magnetic regions comprising a magnetic material having a positive magnetostriction and exhibiting a horizontal magnetic orientation.

* * * * *